United States Patent
Ching et al.

(10) Patent No.: US 9,257,428 B2
(45) Date of Patent: Feb. 9, 2016

(54) STRUCTURE AND METHOD FOR FINFET DEVICE

(71) Applicant: Taiwan Semiconductor Manufacturing Company, Ltd., Hsin-Chu (TW)

(72) Inventors: Kuo-Cheng Ching, Hsinchu County (TW); Ka-Hing Fung, Hsinchu County (TW); Zhiqiang Wu, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/504,258

(22) Filed: Oct. 1, 2014

(65) Prior Publication Data

US 2015/0311207 A1 Oct. 29, 2015

Related U.S. Application Data

(63) Continuation-in-part of application No. 14/290,625, filed on May 29, 2014.

(60) Provisional application No. 61/983,770, filed on Apr. 24, 2014, provisional application No. 62/034,926, filed on Aug. 8, 2014.

(51) Int. Cl.
*H01L 21/00* (2006.01)
*H01L 27/092* (2006.01)
(Continued)

(52) U.S. Cl.
CPC .... *H01L 27/0924* (2013.01); *H01L 21/823807* (2013.01); *H01L 21/823814* (2013.01); *H01L 21/823821* (2013.01); *H01L 29/165* (2013.01); *H01L 29/785* (2013.01)

(58) Field of Classification Search
CPC . H01L 27/0924; H01L 29/785; H01L 29/165; H01L 21/823821; H01L 21/823814; H01L 21/823807
See application file for complete search history.

(56) References Cited

U.S. PATENT DOCUMENTS 6,359,311 B1 3/2002 Colinge et al.
6,855,582 B1 * 2/2005 Dakshina-Murthy et al. ................. H01L 29/42392 257/618

(Continued)

OTHER PUBLICATIONS

Masanori Tanaka et al., "Abnormal Oxidation Characteristics of SiGe/Si-on-insulator Structures Depending on Piled-Up Ge Fraction at SiO2/SiGe Interface," Journal of Applied Physics 103, 2008, pp. 054909-1 through 054909-5, American Institute of Physics.

(Continued)

*Primary Examiner* — Richard Booth
(74) *Attorney, Agent, or Firm* — Haynes and Boone, LLP

(57) ABSTRACT

The present disclosure provides an embodiment of a fin-like field-effect transistor (FinFET) device. The device includes a plurality of first fin structures over a substrate. The first fin structure includes a first semiconductor material layer, a second semiconductor material layer disposed over the first semiconductor material layer, being at least partially surrounded by a semiconductor oxide feature. The device also includes a third semiconductor material layer disposed over the second semiconductor material layer and a second fin structures over the substrate and adjacent to one of the first fin structures. The second fin structure includes the first semiconductor material layer and the third semiconductor material layer disposed over the dielectric layer.

20 Claims, 26 Drawing Sheets

(51) Int. Cl.
*H01L 29/78* (2006.01)
*H01L 29/165* (2006.01)
*H01L 21/8238* (2006.01)

(56) References Cited

U.S. PATENT DOCUMENTS

| | | | |
|---|---|---|---|
| 6,864,164 B1 * | 3/2005 | Dakshina-Murthy et al. | H01L 29/66545 257/E21.444 |
| 7,719,043 B2 * | 5/2010 | Yamagami et al. | H01L 21/823807 257/306 |

OTHER PUBLICATIONS

F. K. Legoues, et al., "Kinetics and Mechanism of Oxidation of SiGe: Dry Versus Wet Oxidation," Applied Physics Letters 54, Feb. 13, 1989, pp. 644-646, American Institute of Physics.

Tetlin et al., "Kinetics and Mechanism of Low Temperature Atomic Oxygen-Assisted Oxidation of SiGe Layers," Journal of Applied Physics, Mar. 1, 1998, pp. 2842-2846, vol. 83, No. 5, American Institute of Physics.

P. Gas et al., "Diffusion of Sb, Ga, Ge, and (AS) in TiSi2," Journal of Applied Physics, Jun. 1, 1988, pp. 5335-5345, vol. 63, No. 11, American Institute of Physics.

U.S. Appl. No. 13/934,992, filed on Jul. 3, 2013, by inventors Kuo-Cheng Ching, Chih-Hao Wang, Zhiqiang Wu and Carlos H. Diaz for "Fin Structure of Semiconductor Device," 21 pages of text, 12 pages of drawings.

U.S. Appl. No. 13/740,373, filed on Jan. 14, 2013, by inventors Chih-Hao Wang, Kuo-Cheng Ching, Gwan Sin Chang, and Zhiqiang Wu for "Semiconductor Device and Fabricating the Same," 21 pages of text, 17 pages of drawings.

U.S. Appl. No. 13/902,322, filed on May 24, 2013, by inventors Chih-Hao Wang, Kuo-Cheng Ching, Gwan Sin Chang, and Zhiqiang Wu for "FinFET Device and Method of Fabricating Same," 20 pages of text, 15 pages of drawings.

U.S. Appl. No. 14/155,793, filed on Jan. 15, 2014, by inventors Kuo-Cheng Ching, Chih-Hao Wang, Zhiqiang Wu and Carlos H. Diaz for "Semiconductor Device and Formation Thereof," 16 pages of text, 12 pages of drawings.

* cited by examiner

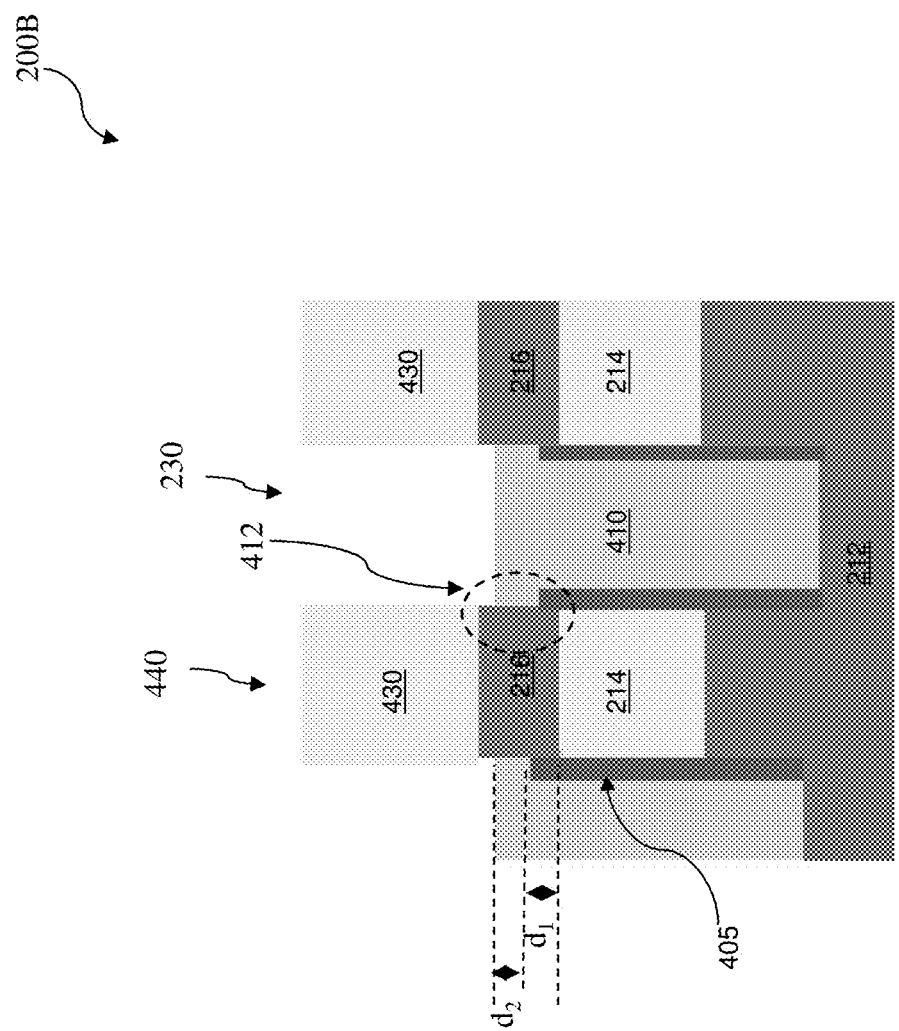

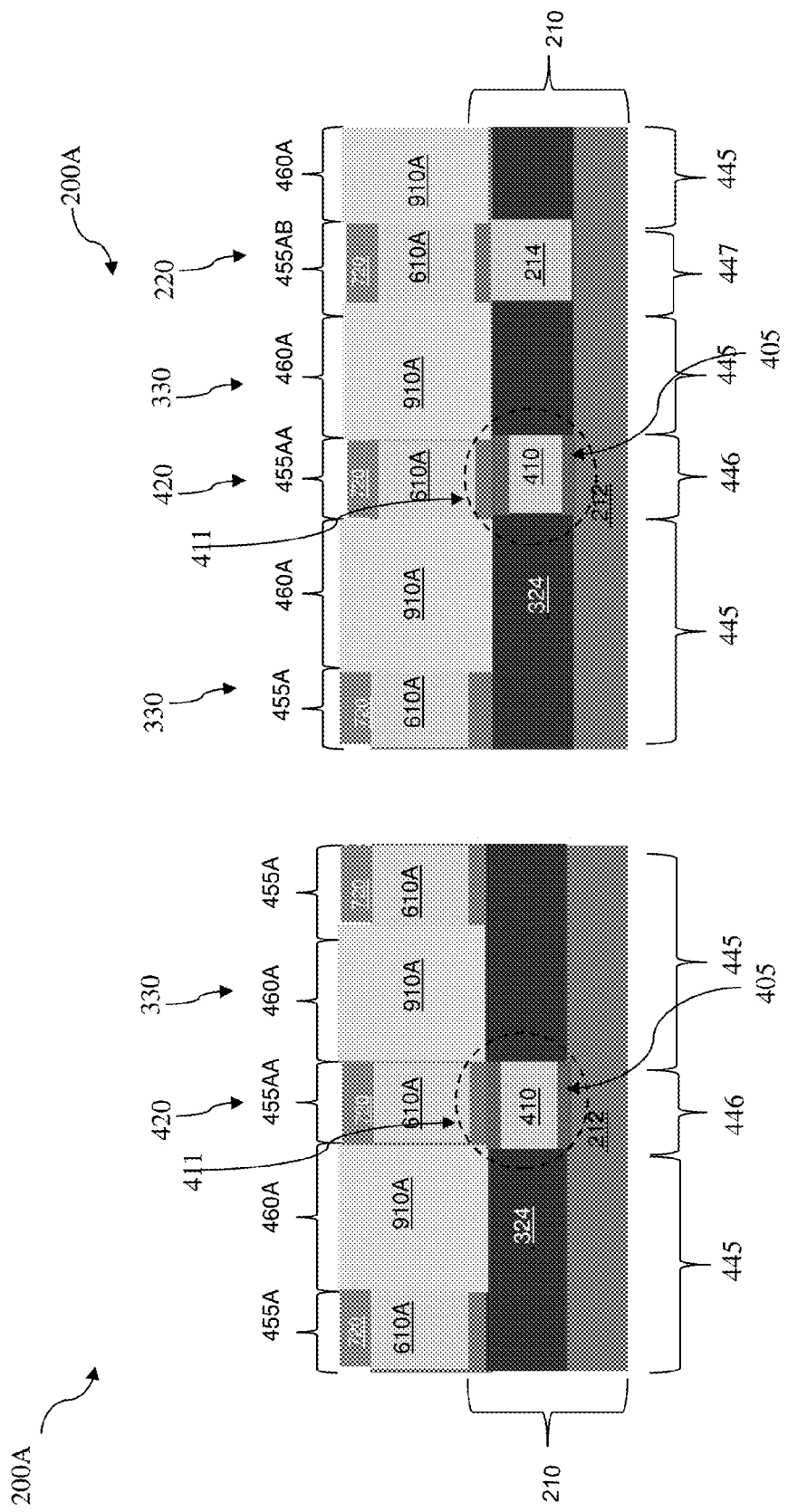

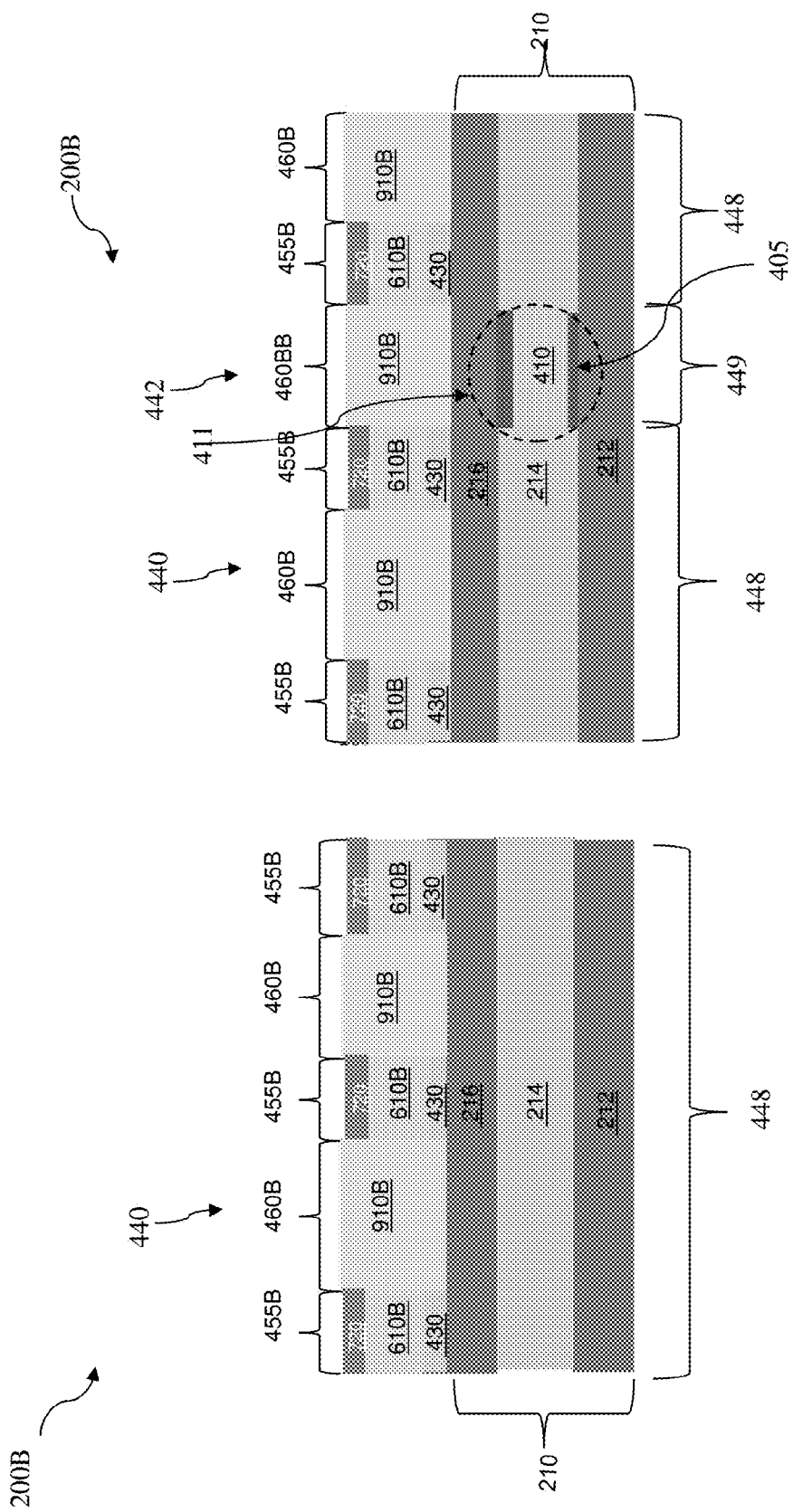

US 9,257,428 B2

STRUCTURE AND METHOD FOR FINFET DEVICE

This application is a continuation-in-part of U.S. application Ser. No. 14/290,625, filed on May 29, 2014, which claims priority to U.S. Provisional Application No. 61/983,770, filed Apr. 24, 2014, each of which is incorporated herein by reference in its entirety. This application additionally claims priority to U.S. Provisional Patent Application No. 62/034,926, filed on Aug. 8, 2014, which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIG. 12D is a cross-sectional view of an example FinFET device along the line B-B in FIG. 11 at fabrication stages constructed according to the method of FIG. 1.

FIGS. 16C-16D are cross-sectional views of an example FinFET device along the line AB-AB in FIG. 16A at fabrication stages constructed according to the method of FIG. 1.

FIGS. 16E-16F are cross-sectional views of an example FinFET device along the line BB-BB in FIG. 16B at fabrication stages constructed according to the method of FIG. 1.

DETAILED DESCRIPTION

Figure 1:
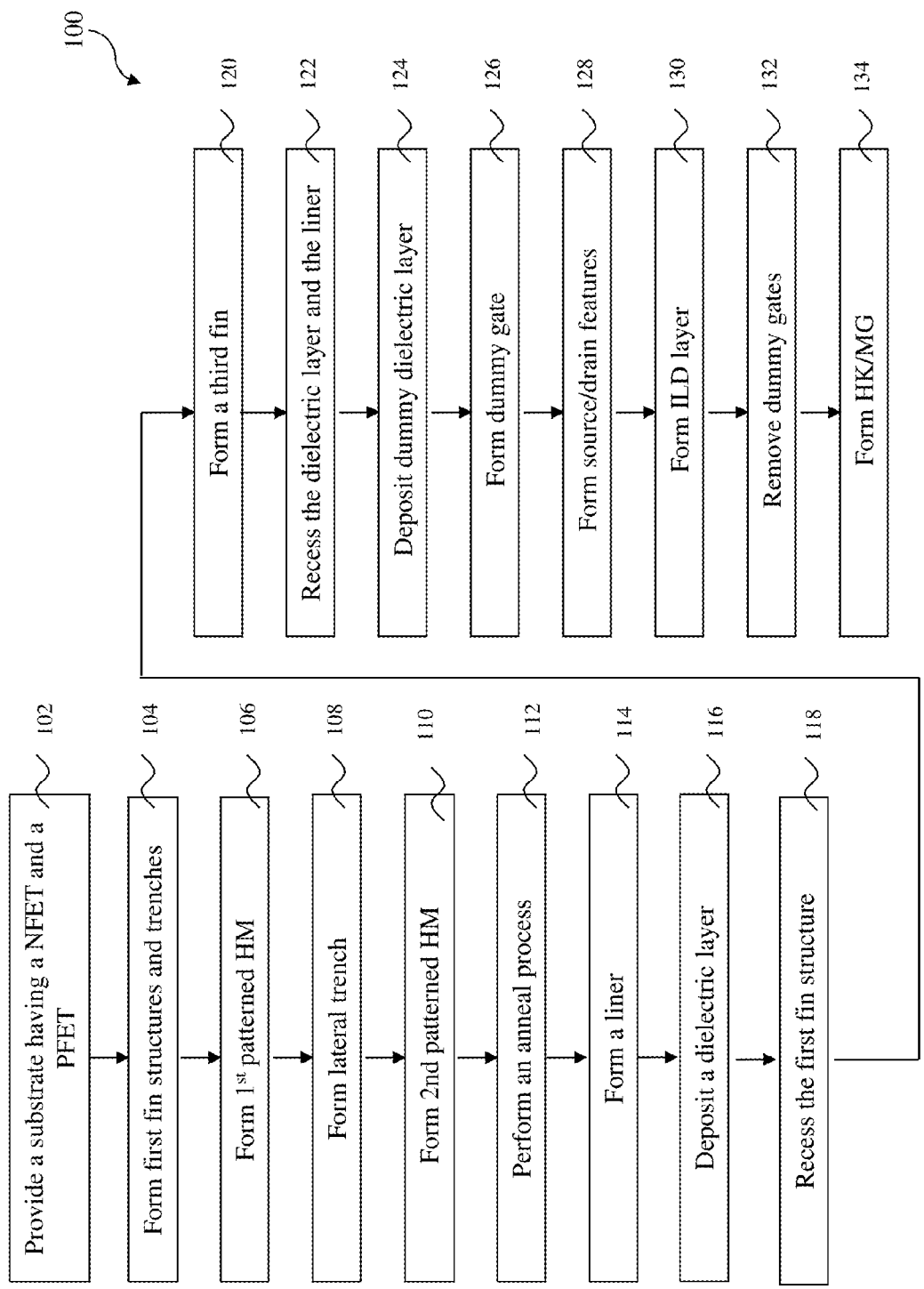
FIG. 1 is a flow chart of an example method for fabricating a FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a FinFET device 200 in accordance with some embodiments. It is understood that additional steps may be implemented before, during, and after the method, and some of the steps described may be replaced or eliminated for other embodiments of the method. The FinFET device 200 and the method 100 making the same are collectively described with reference to various figures.

Figure 2B:
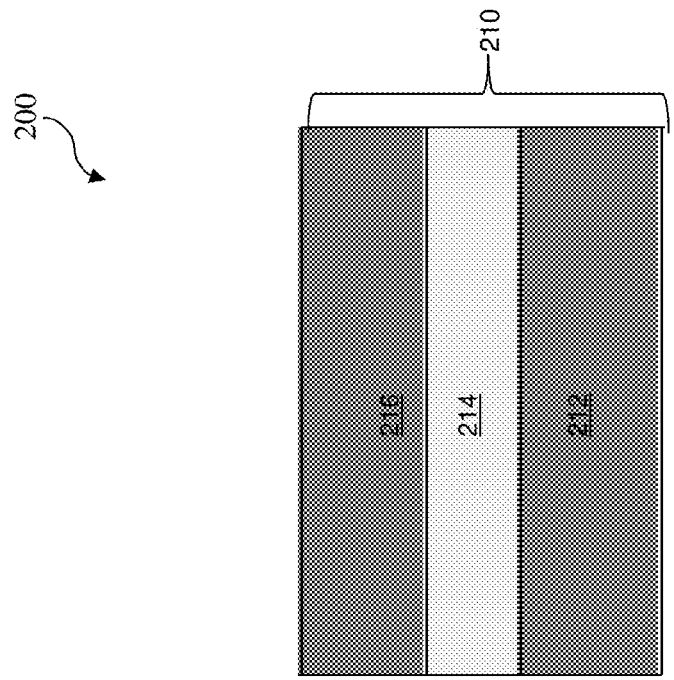
FIG. 2B is a cross-sectional view of an example FinFET device along the line A-A in FIG. 2A at fabrication stages constructed according to the method of FIG. 1.
Figure 2A:
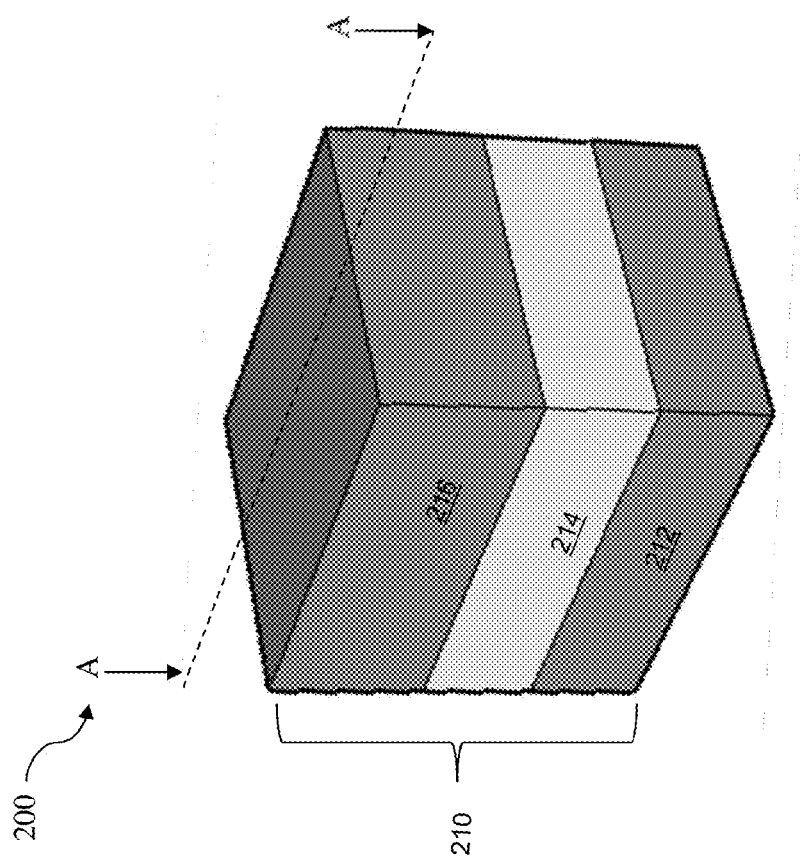
FIG. 2A is a diagrammatic perspective view of an example FinFET device undergoing processes in accordance with some embodiments.

Referring to FIGS. 1 and 2A-2B, the method 100 begins at step 102 by providing a substrate 210. The substrate 210 may include a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods.

In the present embodiment, the substrate 210 includes a first semiconductor material layer 212, a second semiconductor material layer 214 disposed over the first semiconductor material layer 212 and a third semiconductor material layer 216 disposed over the second semiconductor material layer 214. The second and third semiconductor material layers, 214 and 216, are different from each other. The second semiconductor material layer 214 has a first lattice constant and the third semiconductor material layer 216 has a second lattice constant different from the first lattice constant. In the present embodiment, the second semiconductor material layer 214 includes silicon germanium (SiGe), and both of the first and the third semiconductor material layers, 212 and 216, include silicon. In various examples, the first, the second and the third semiconductor material layers, 212, 214 and 216, may include germanium (Ge), silicon (Si), gallium arsenide (GaAs), aluminum gallium arsenide (AlGaAs), silicon germanium (SiGe), gallium arsenide phosphide (GaAsP), or other suitable materials. In the present embodiment, the second and the third semiconductor material layers, 214 and 216, are deposited by epitaxial growth, referred to as a blanket channel epi. In various examples, the epitaxial processes include CVD deposition techniques (e.g., vapor-phase epitaxy (VPE) and/or ultra-high vacuum CVD (UHV-CVD)), molecular beam epitaxy, and/or other suitable processes.

The substrate 210 may include various doped features depending on design requirements as known in the art. In some embodiment, the substrate 210 may include various doped regions depending on design requirements (e. g., p-type substrate or n-type substrate). In some embodiment, the doped regions may be doped with p-type or n-type dopants. For example, the doped regions may be doped with p-type dopants, such as boron or $BF_2$; n-type dopants, such as phosphorus or arsenic, and/or combination thereof. The doped regions may be configured for an n-type FinFET (NFET), or alternatively configured for a p-type FinFET (PFET).

Figure 3B:
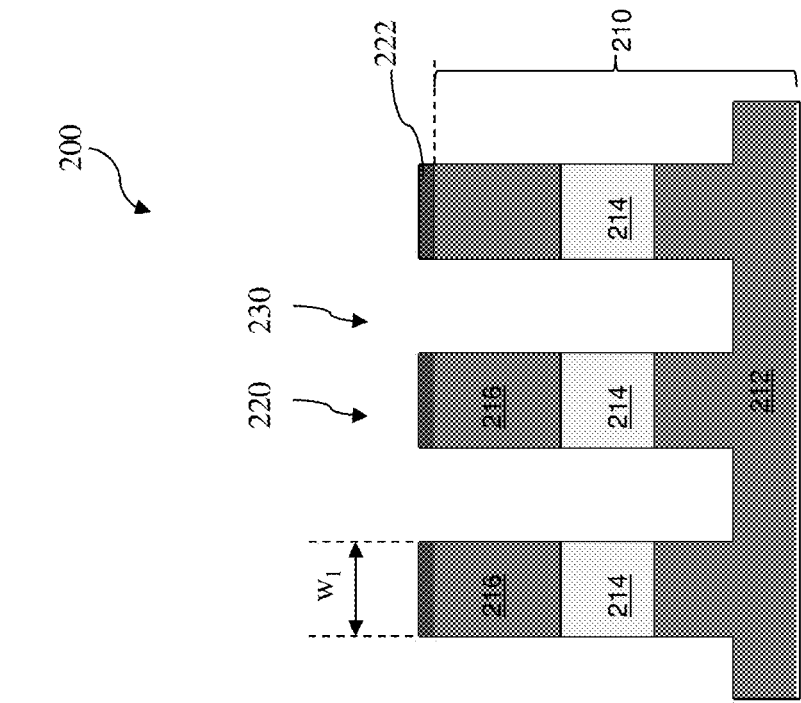
FIG. 3B is a cross-sectional view of an example FinFET device alone the line A-A in FIG. 3A at fabrication stages constructed according to the method of FIG. 1.
Figure 3A:
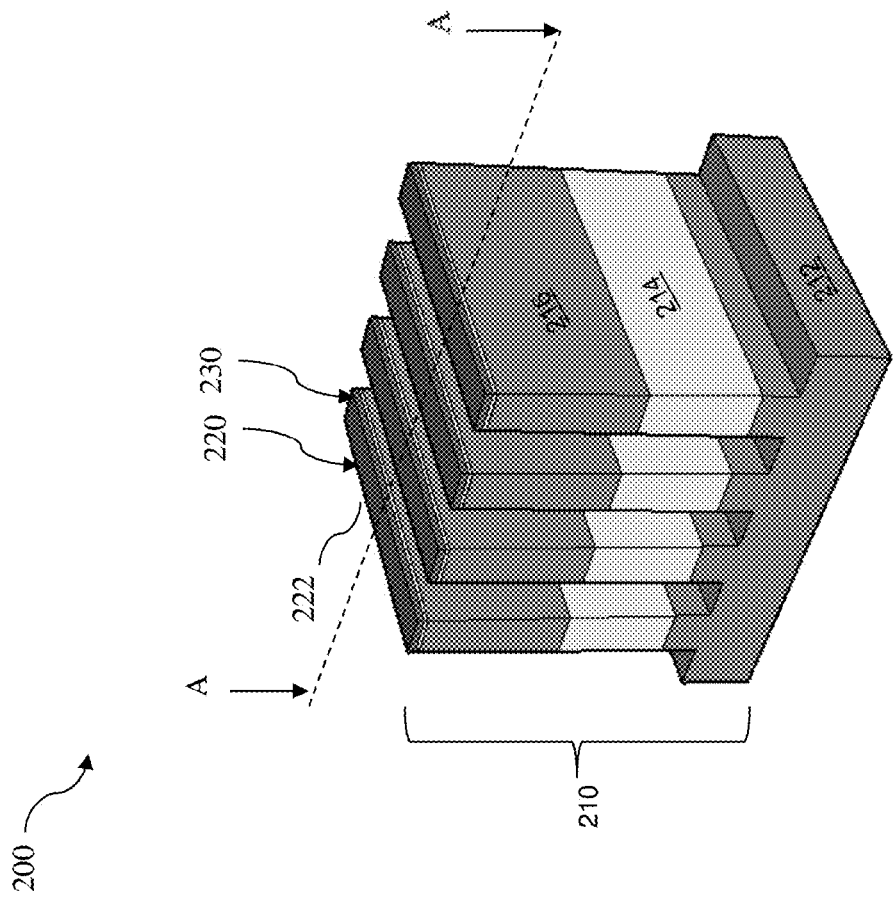
FIG. 3A is a diagrammatic perspective view of an example FinFET device undergoing processes in accordance with some embodiments.

Referring to FIGS. 1 and 3A-3B, the method 100 proceeds to step 104 by forming first fin structures 220 and trenches 230 in the substrate 210. A patterned fin hard mask (FHM) layer 222 is formed over the substrate 210. The patterned FHM layer 222 includes silicon oxide, silicon nitride, silicon oxynitride, or any other suitable dielectric material. The patterned hard mask layer 222 may include a single material layer or multiple material layers.

The patterned FHM layer 222 may be formed by depositing a material layer by thermal oxidation, chemical vapor deposition (CVD), atomic layer deposition (ALD), or any other appropriate method, forming a patterned photoresist (resist) layer by a lithography process, and etching the material layer through the openings of the patterned photoresist layer to form the patterned FHM layer 222. An exemplary photolithography process may include forming a photoresist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing.

The substrate 210 is etched through the patterned FHM layer 222 to form the first fin structures 220 and the trenches 230 in the substrate 210. In another embodiment, the patterned photoresist layer is directly used the patterned FHM layer 222 as an etch mask of the etch process to form the first fin structures 220 and the trenches 230 in the substrate 210. The etching process may include a wet etch or a dry etch. In one embodiment, the wet etching solution includes a tetramethylammonium hydroxide (TMAH), a HF/HNO3/CH3COOH solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gases include $CF_4$, $NF_3$, $SF_6$, and He. Dry etching may also be performed anisotropically using such mechanism as DRIE (deep reactive-ion etching).

In the present embodiment, the etching depth is controlled such that the third and the second semiconductor material layers, 216 and 214 are exposed but the first semiconductor material layer 212 is partially exposed in the trench 230. Thus the first fin structure 220 is formed to have the third semiconductor material layer 216 as an upper portion, the second semiconductor material layer 214 as a middle portion and the first semiconductor material layer 212 as a bottom portion. Additionally, the first fin structure 220 has a first width $w_1$ in a range of about 4 nm to about 10 nm.

Figure 4:
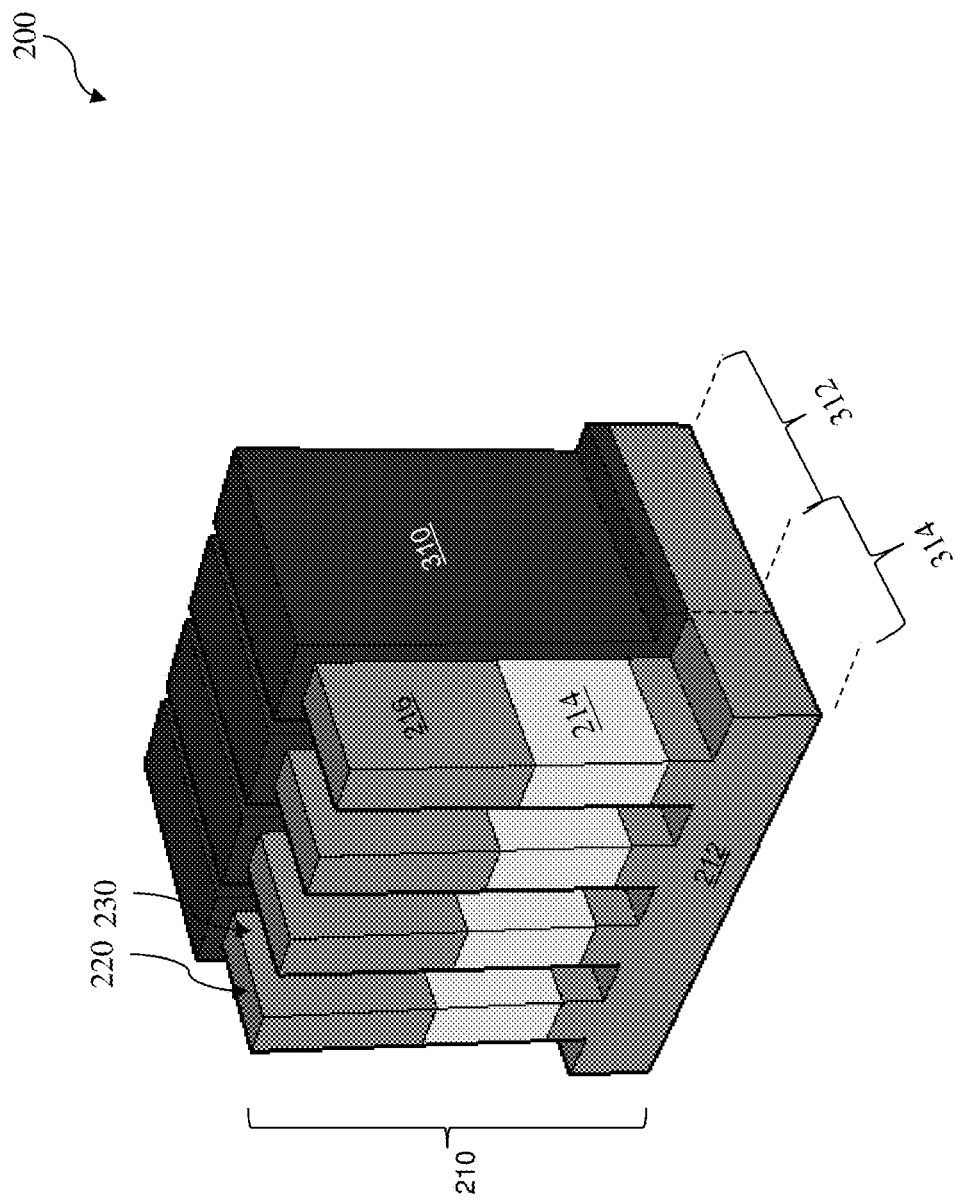
FIGS. 4, 5, 6A-6B and 7A-7B are diagrammatic perspective views of a FinFET device undergoing processes in accordance with some embodiments.

Referring to FIGS. 1 and 4, the method 100 proceeds to step 106 by forming a first patterned hard-mask (HM) 310 over the substrate 210, including wrapping around a portion of the first fin structures 220. In the present embodiment, the first patterned HM 310 covers a first region 312 and exposes a second region 314 in the substrate 210. The first patterned HM layer 310 may include silicon oxide, silicon nitride, silicon oxynitride, or any other suitable dielectric material. The first patterned HM layer 310 may be formed by depositing a material layer by thermal oxidation, chemical CVD, ALD, or any other appropriate method, forming a patterned photoresist (resist) layer by a lithography process, and etching the material layer through the openings of the patterned photoresist layer to form the first patterned HM layer 310.

Figure 5:
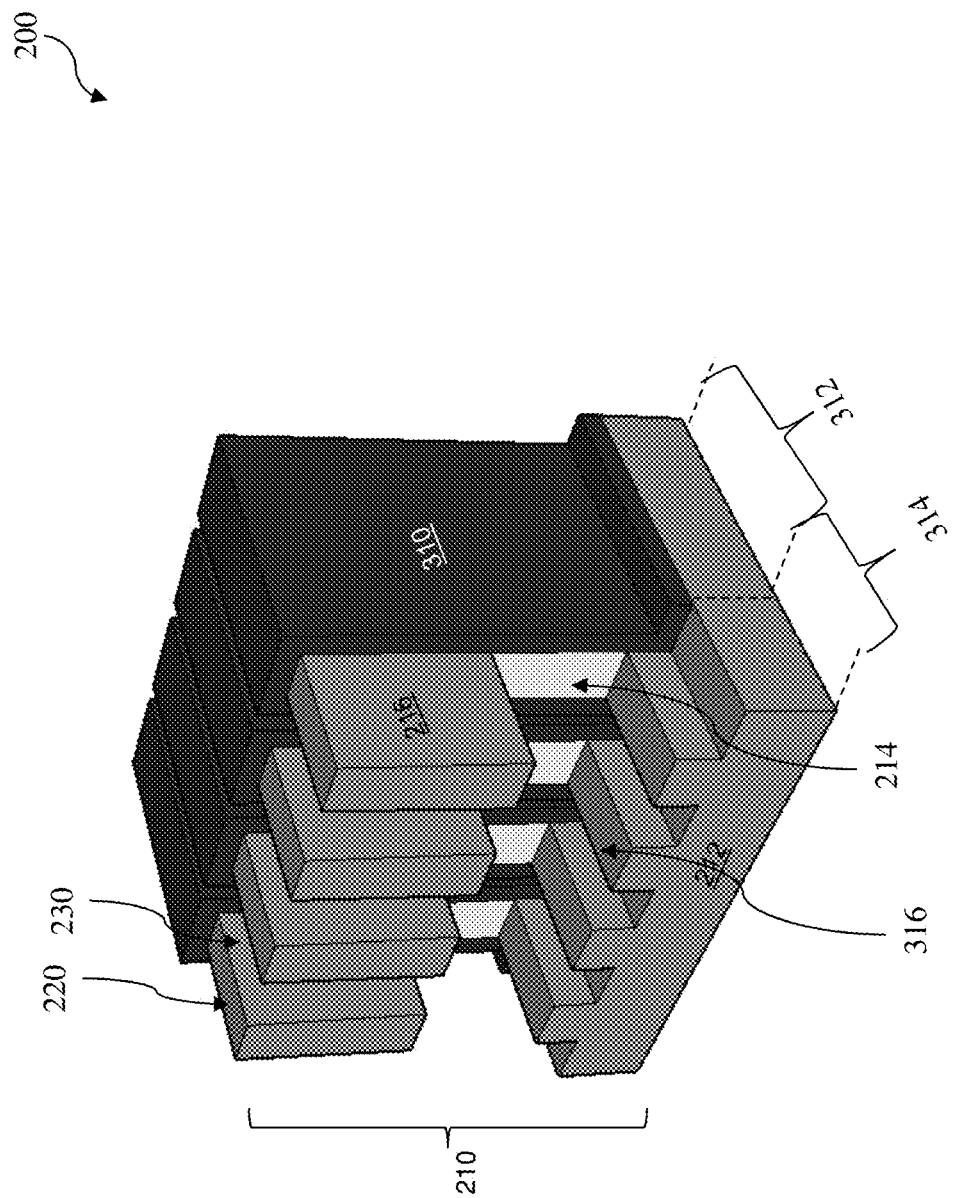

Referring also to FIGS. 1 and 5, the method 100 proceeds to step 108 by removing the second semiconductor material layer 214 in the second region 314 to form a lateral trench 316 (or space/opening), where a surface of the second semiconductor material layer 214 is exposed in the lateral trench 316. With the lateral trench 316, a length of the first fin structure 220 is cut to a shorter length. The second semiconductor material layer 214 may be removed by a selective wet etch, or a selective dry etch. In one embodiment, the SiGe layer 214 in the second region 314 is selectively removed while the SiGe layer 214 in the first region 312 remains, which is protected by the HM 310. The etching process includes a wet etch with $HF:HNO_3:CH_3COOH$ solution, that removes the second semiconductor material layer 214 but substantially does not remove the Si layers 212 and 216.

The above discussion with respect to FIGS. 1 through 5B applies to a method of manufacturing either an NFET device and/or a PFET device. The process described below, in reference to FIGS. 1 and 6A-16F discusses the process of manufacturing either an NFET device and/or a PFET device. In some embodiment, the FinFET device 200 includes an NFET device, designated with the reference numeral 200A and referred to as the NFET device 200A. The FinFET device 200 also includes a PFET device, designated with the reference numeral 200B and referred to as the PFET device 200B.

Figure 6B:
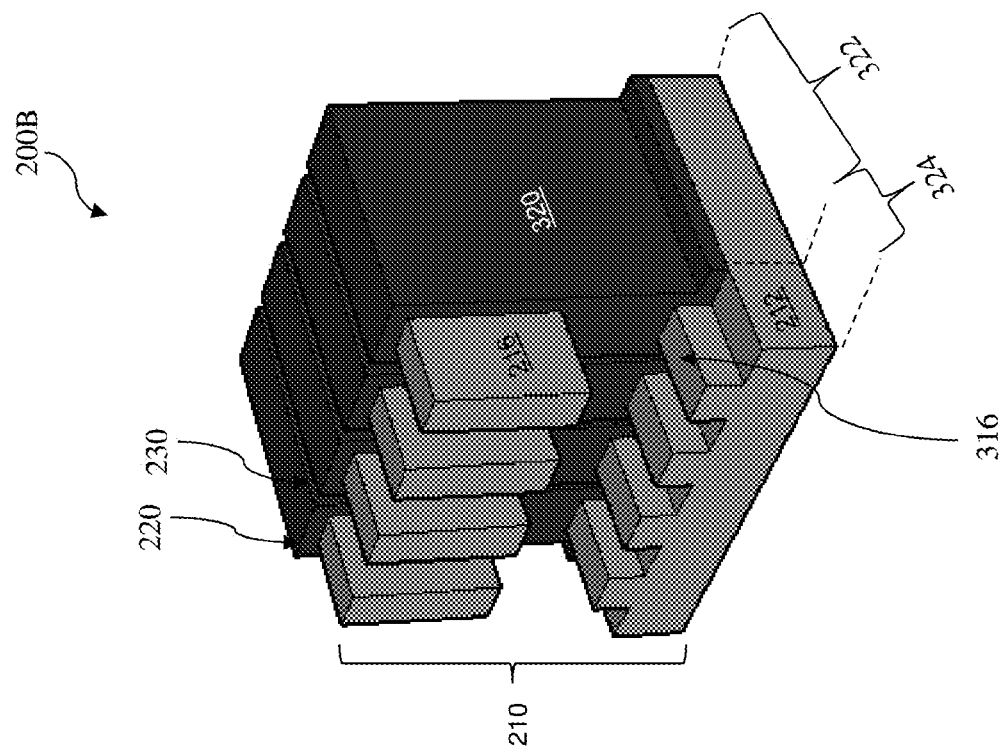
Figure 6A:
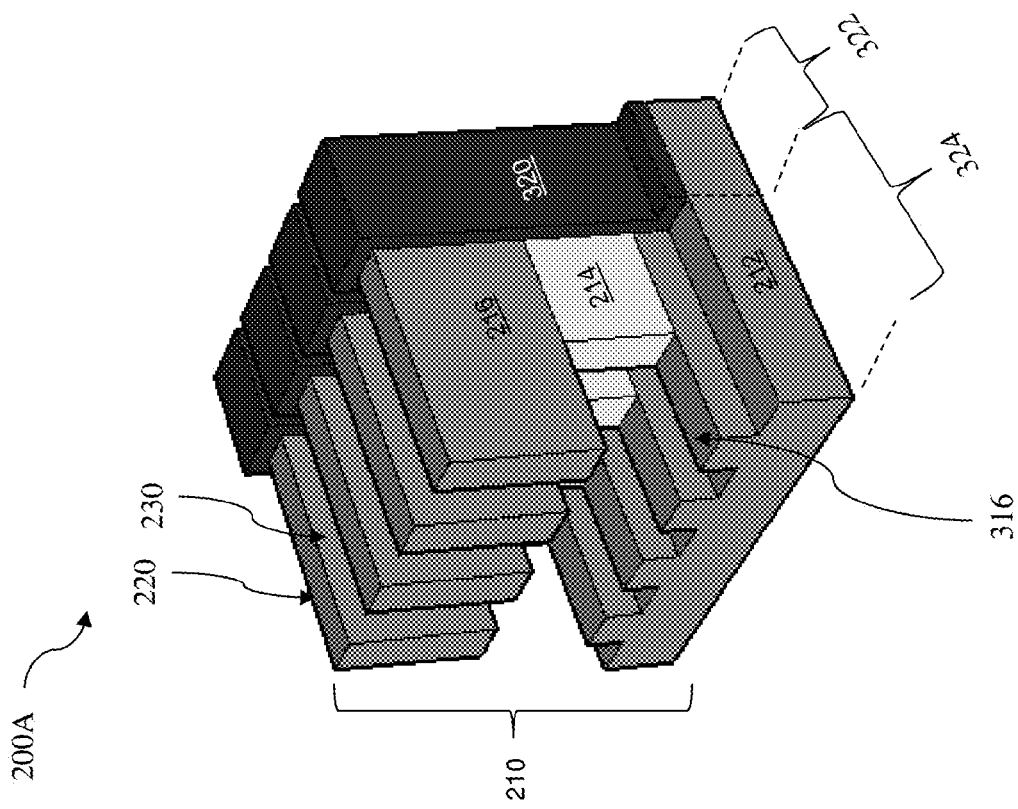
Figures 7A, 7B:
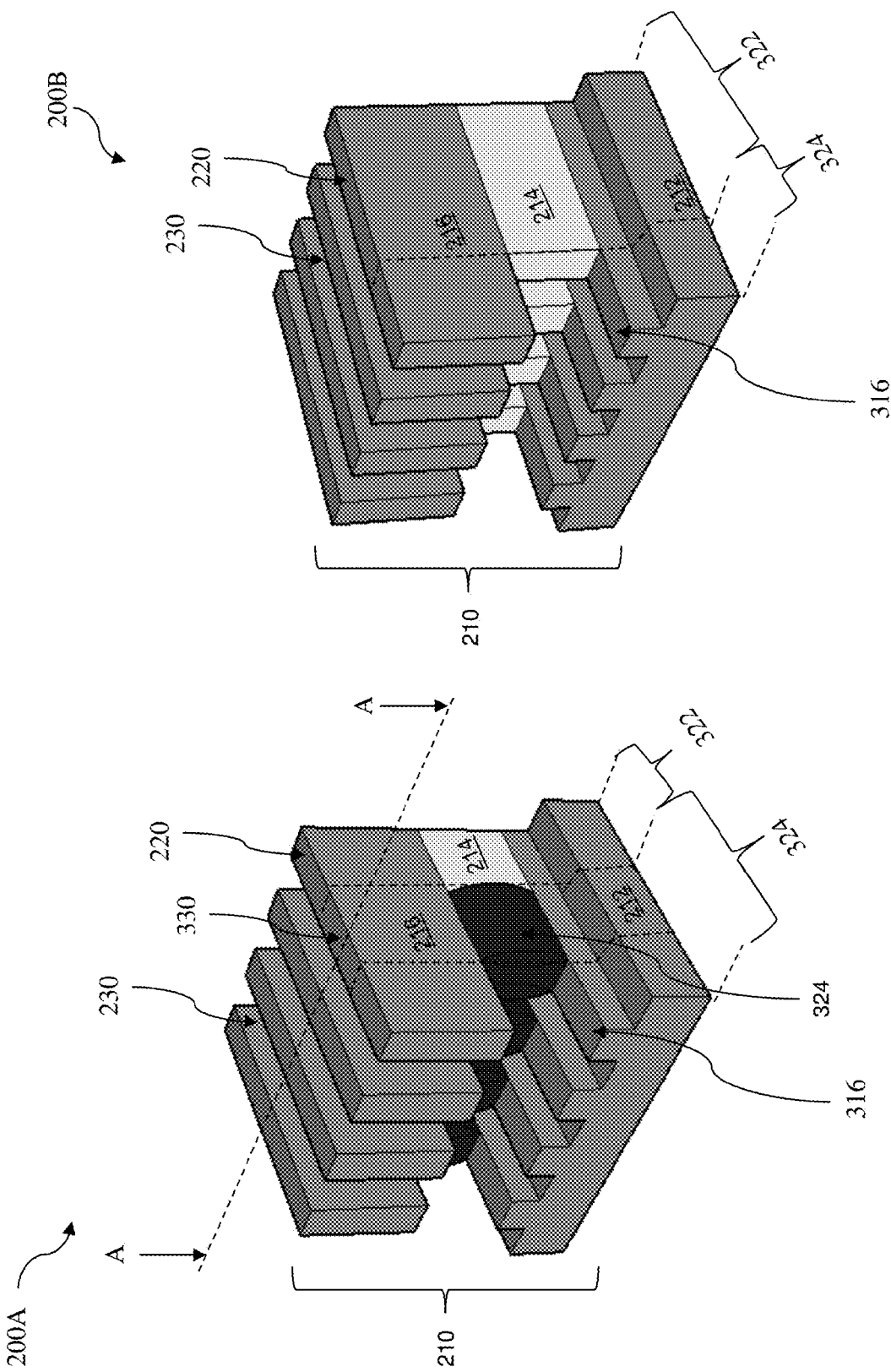
Figure 7C:
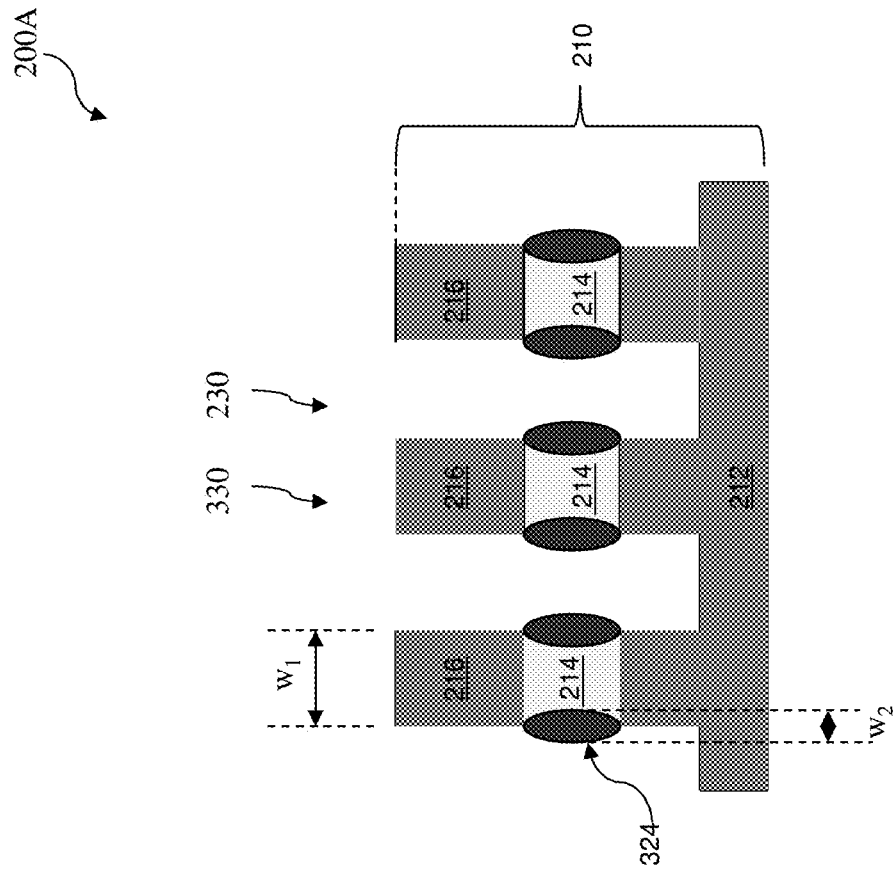
FIG. 7C is a cross-sectional view of an example FinFET device along the line A-A in FIG. 7A at fabrication stages constructed according to the method of FIG. 1.

Referring also to FIGS. 1 and 6A-6B, the method 100 proceeds to step 110 by removing the first patterned HM 310 and forming a second patterned HM 320. The first patterned HM 310 may be removed by a selective wet etch, or a selective dry etch. The second patterned HM 320 is then formed to cover a third region 322 and exposes a fourth region 324 in the substrate 210. In the present embodiment, in the NFET device 200A, a portion of the second semiconductor material layer 214 adjacent to the lateral trenches 316 is uncovered by the second HM 320. While in the PFET device 200B, the second semiconductor material layer 214 is covered, including covering the surface of the second semiconductor material layer 214 in the lateral trench 316. The second patterned HM layer 320 may include silicon oxide, silicon nitride, silicon oxynitride, or any other suitable dielectric material. The second patterned HM layer 320 may be formed by depositing, lithography patterning and etching processes.

Referring also to FIGS. 1 and 7A-7C, the method 100 proceeds to step 112 by performing a thermal oxidation process to the FinFET device 200. In one embodiment, the thermal oxidation process is conducted in oxygen ambient. In another embodiment, the thermal oxidation process is conducted in a combination of steam ambient and oxygen ambient. In the fourth region 324 of the NFET 200A, during the thermal oxidation process, an outer layer of the exposed second semiconductor material layers 214 is converted to a semiconductor oxide features 324. While the second semiconductor material layer 214 in the PFET is covered by the second HM 320 to prevent being oxidized. In the present embodiment, the thermal oxidation process is controlled such that the second semiconductor material layer 214 oxidizes much faster that the first and third semiconductor material layers, 212 and 216. In another words, comparing to the second semiconductor oxide feature 324, semiconductor oxide features formed over the first and third semiconductor material layer 212 and 216 are quite thin. Therefore, the thermal oxidation process is referred to as a selective oxidation. As an example, the thermal oxidation process is performed in a $H_2O$ reaction gas with a temperature ranging from about 400° C. to about 600° C. and under a pressure ranging from about 1 atm. to about 20 atm. After the oxidation process, a cleaning process is performed to remove the thin semiconductor oxide features over the first and second semiconductor layers 212 and 216. The cleaning process may be performed using diluted hydrofluoric (DHF) acid.

After the thermal oxidation process, the first fin structure in the fourth region 324 has a different structure than those in the third region 322. For the sake of clarity to better description, the first fin structure 220 in the fourth region 324 (having the second semiconductor oxide feature 324) is referred to as a second fin structure 330. Thus the second fin structure 330 has the third semiconductor material layer 216 disposed over the second semiconductor material layer 214 and the second semiconductor oxide feature 324. Furthermore, as shown, second semiconductor oxide feature 324 surrounds second semiconductor material layer 214. The second HM 320 is removed after performing the thermal oxidation process. For example, second HM 320 is removed by etching processes.

Referring again to FIG. 7C, in the present example, the second semiconductor oxide features 324 extends in the vertical direction with a horizontal dimension varying from the top surface to the bottom surface of the second semiconductor material layer 214. In furtherance of the present example, the horizontal dimension of the second semiconductor oxide features 324 reaches its maximum, referred to as a first width $w_1$, and decreases to close to zero when approaches to the top and bottom surfaces of the second semiconductor oxide features 324, resulting in an olive shape in a cross-sectional view. By tuning of the thermal oxidation process, selecting a composition and thickness of the second semiconductor material layer 214 and tuning the oxidation temperature, it achieves a target second width $w_2$ of the second semiconductor oxide feature 324, which applies an adequate stress to the third semiconductor material layer 216 in the first fin structure 220, where a gate channel is to be defined underlying a gate region, which will be described later.

In one embodiment, the second semiconductor material layer 214 includes silicon germanium ($SiGe_{x_1}$) and both of the first and the third semiconductor material layers, 212 and 216, include silicon (Si). The subscript $x_1$ is a first Ge composition in atomic percent and it may be adjusted to meet a predetermined volume expansion target. In one embodiment, $x_1$ is selected in a range from about 20% to about 80%. An outer layer of the $SiGe_{x_1}$ layer 214 is oxidized by the thermal oxidation process, thereby forming the silicon germanium oxide (SiGeO) feature 324. The second width $w_2$ of the SiGeO feature 324 is in a range of about 3 nm to 10 nm. A center portion of the $SiGe_{x_1}$ layer 214 changes to a second Ge composition $x_2$, which is much higher than $x_1$. A size and shape of the center portion of $SiGe_{x_2}$ vary with process conditions, such as thermal oxidation temperature and time. Also the second Ge composition $x_2$ in the center portion is higher than other portions, such as a top portion, a bottom portion, a left side portion and a right side portion.

Figure 8B:
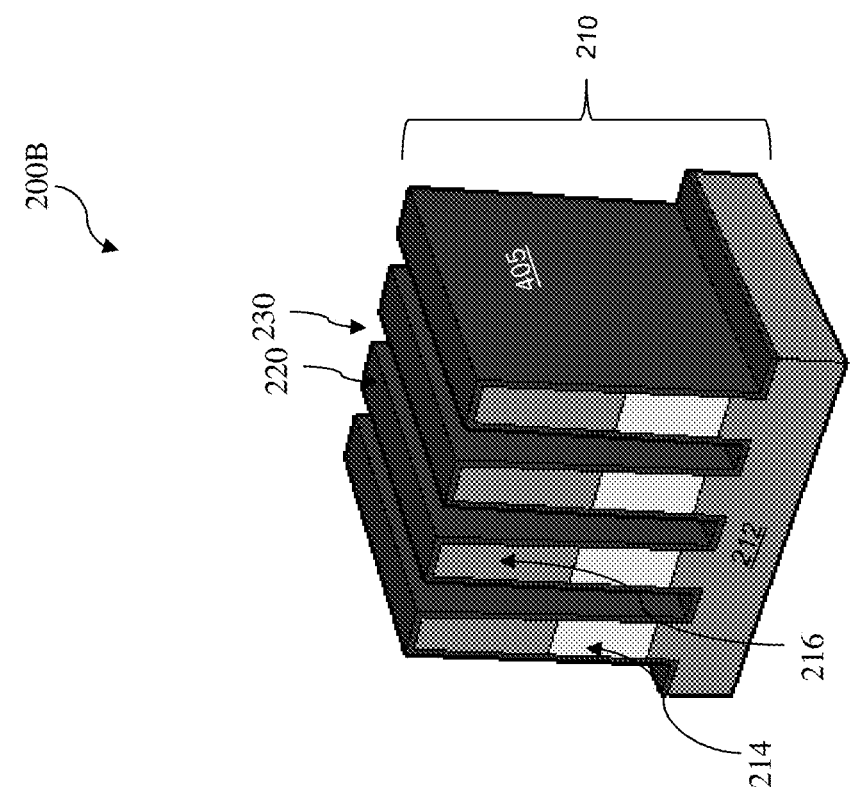
FIGS. 8A-8B and 9A-9B are diagrammatic perspective views of a FinFET device undergoing processes in accordance with some embodiments.
Figure 8A:
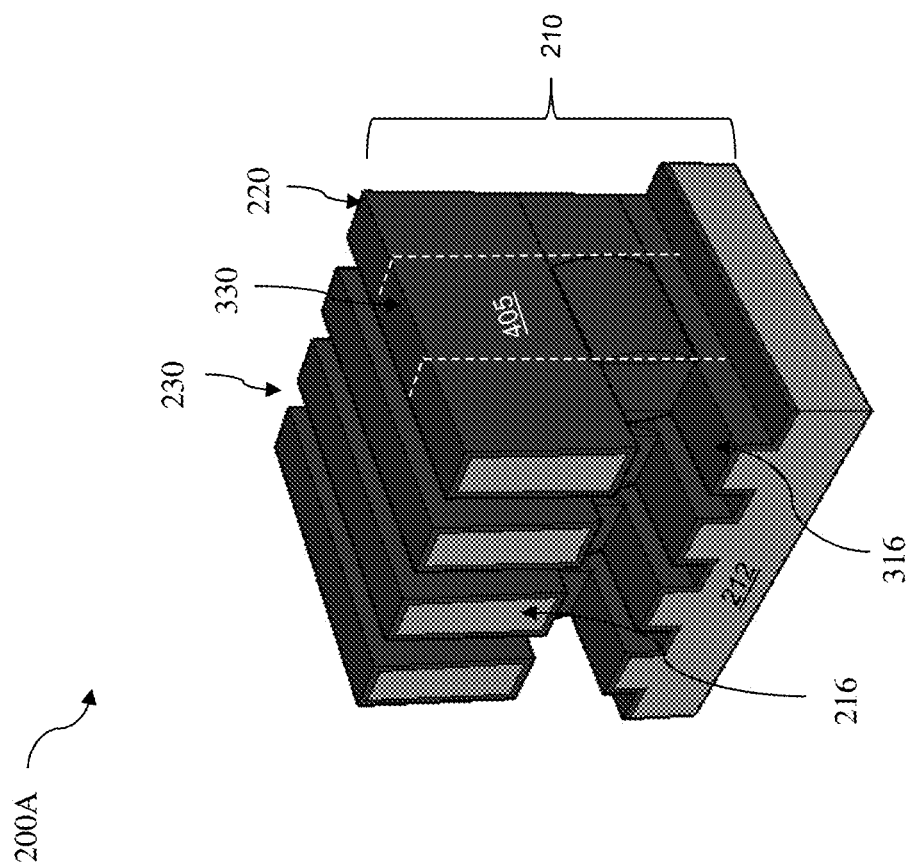

Referring to FIGS. 1 and 8A-8B, the method 100 proceeds to step 114 by depositing a liner 405 to conformably wrap over the first fin structure 220, as well as the second fin structure 330, in both of the NFET device 200A and the PFET device 200B. The liner 405 may include silicon nitride, silicon oxynitride, aluminum oxide, or other suitable materials. In one embodiment, the liner 405 has a first thickness in a range of about 20 Å to about 60 Å. In the present embodiment, the liner 405 is deposited by ALD to achieve adequate film coverage of wrapping over the first fin structure 220. Alternatively, the liner 405 may be deposited by CVD, physical vapor deposition (PVD), or other suitable techniques. In one embodiment, the liner 405 is formed by multiple layers. In the present embodiment, the liner 405 is designed to be a buffer layer to prevent the second semiconductor material layer 214 is oxidized further in the downstream or later processed and a barrier of out-diffusion of the second semiconductor material layer 214, which will be described in detail below.

Figures 9A, 9B:
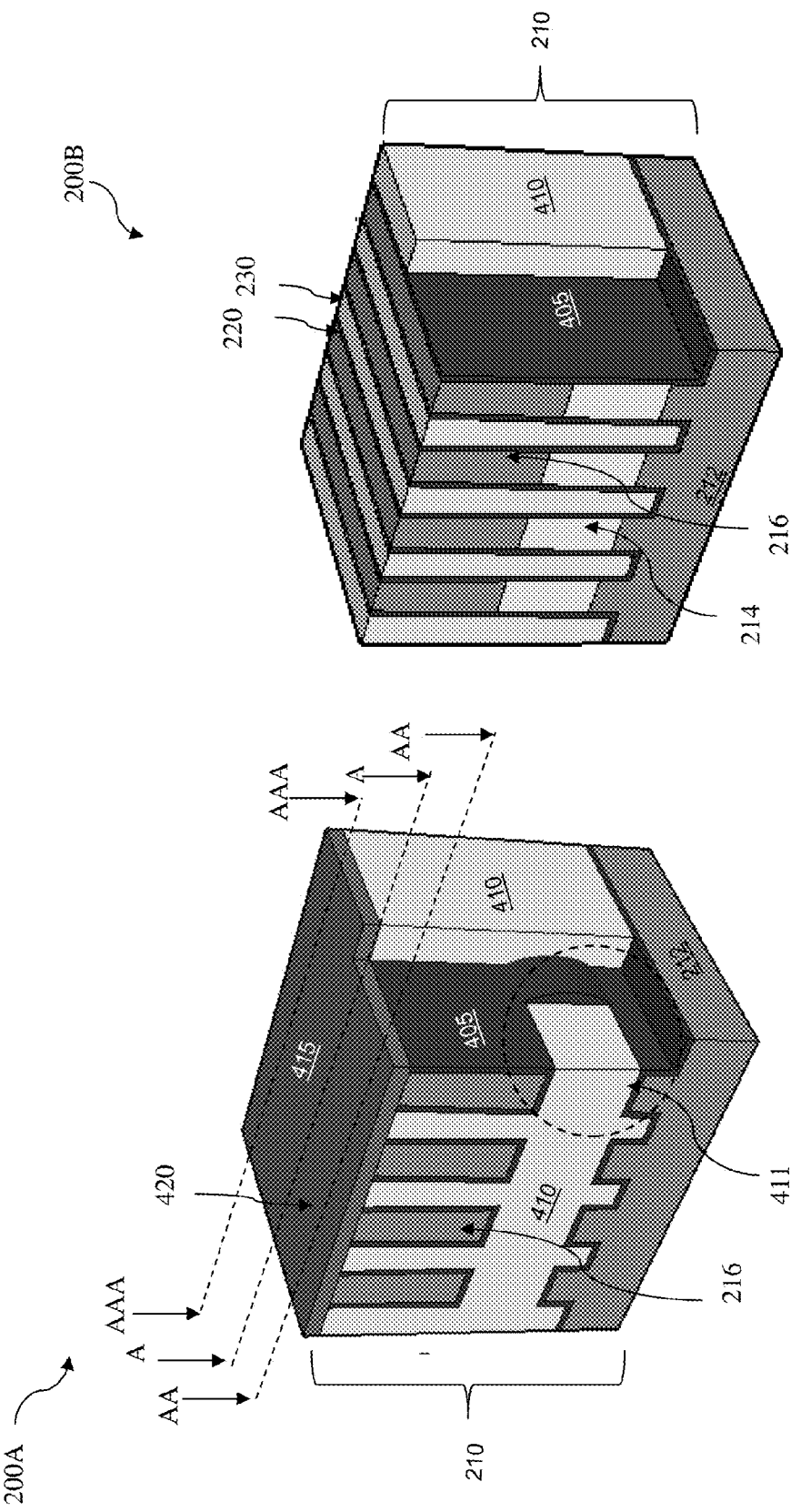

Referring to FIGS. 1 and 9A-9B, the method 100 proceeds to step 116 by depositing a dielectric layer 410 over the substrate 210, including filling in the trench 230. The dielectric layer 410 also fills in the lateral trenches 316 to form a dielectric feature, referred to as a dielectric anchor 411. The dielectric layer 410 may include silicon oxide, silicon nitride, silicon oxynitride, spin-on-glass, spin-on-polymer, or other suitable materials, or combinations thereof. The dielectric layer 410 may be deposited by CVD, PVD, ALD, thermal oxidation, spin-on coating, or other suitable techniques, or a combination thereof. As has been mentioned previously, having the liner 405 cover the first fin structure 220 and the second fin structure 330, it provides a buffer to adverse impacts induced during the formation of the dielectric layer 410, such as in thermal curing process for the dielectric layer 410. A chemical mechanical polishing (CMP) process may be performed thereafter to remove excessive dielectric layer 410 and planarize the top surface of the NFET device 200A and the PFET device 200B.

Figure 9C:
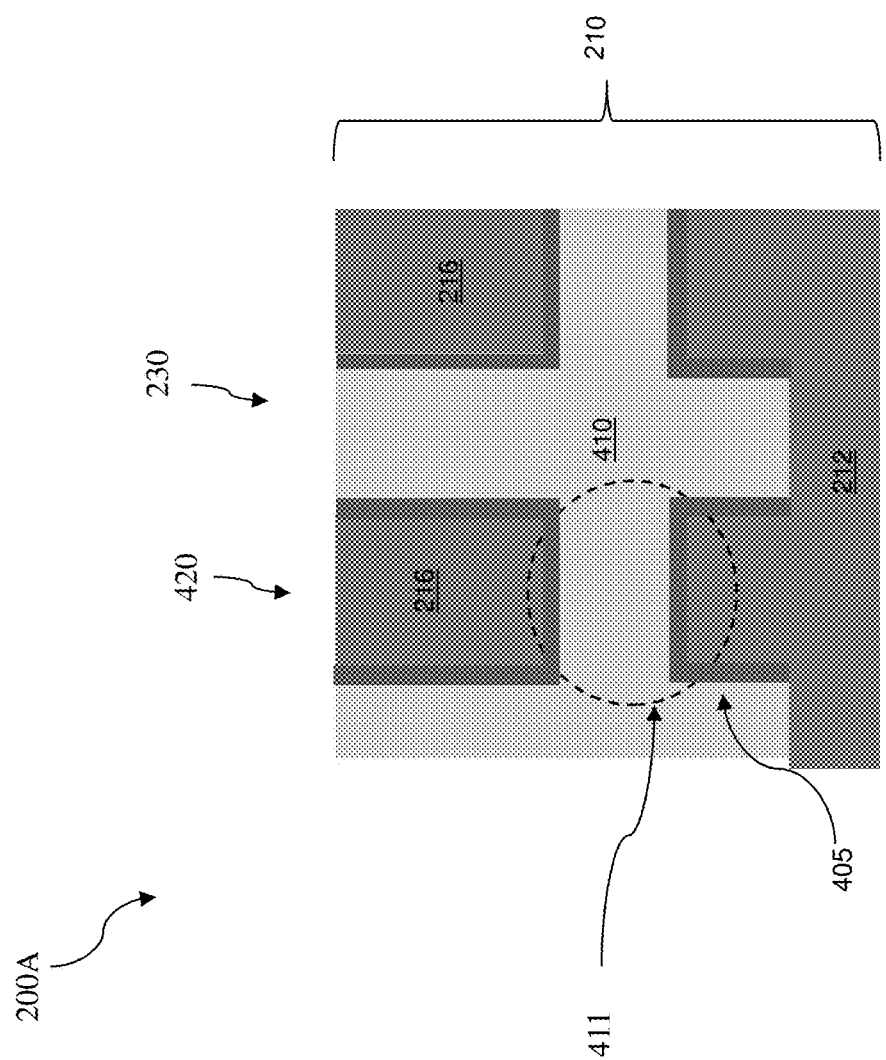
FIG. 9C is a cross-sectional view of an example FinFET device along the line AA-AA in FIG. 9A at fabrication stages constructed according to the method of FIG. 1.
Figure 10A:
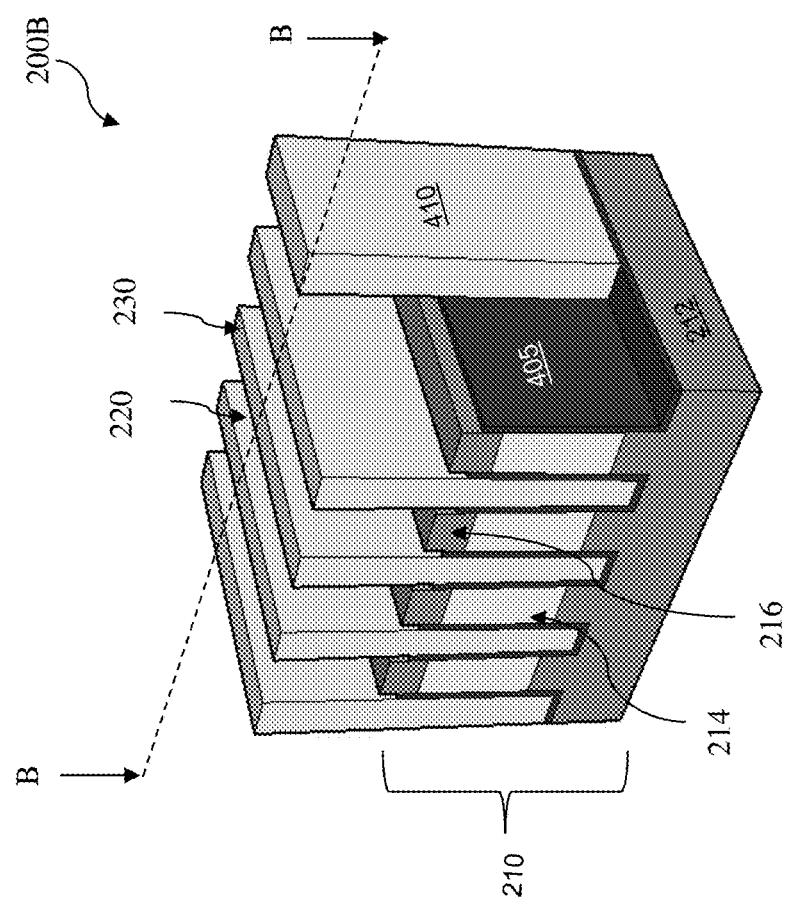
FIG. 10A is a diagrammatic perspective view of a FinFET device undergoing processes in accordance with some embodiments.
Figure 10B:
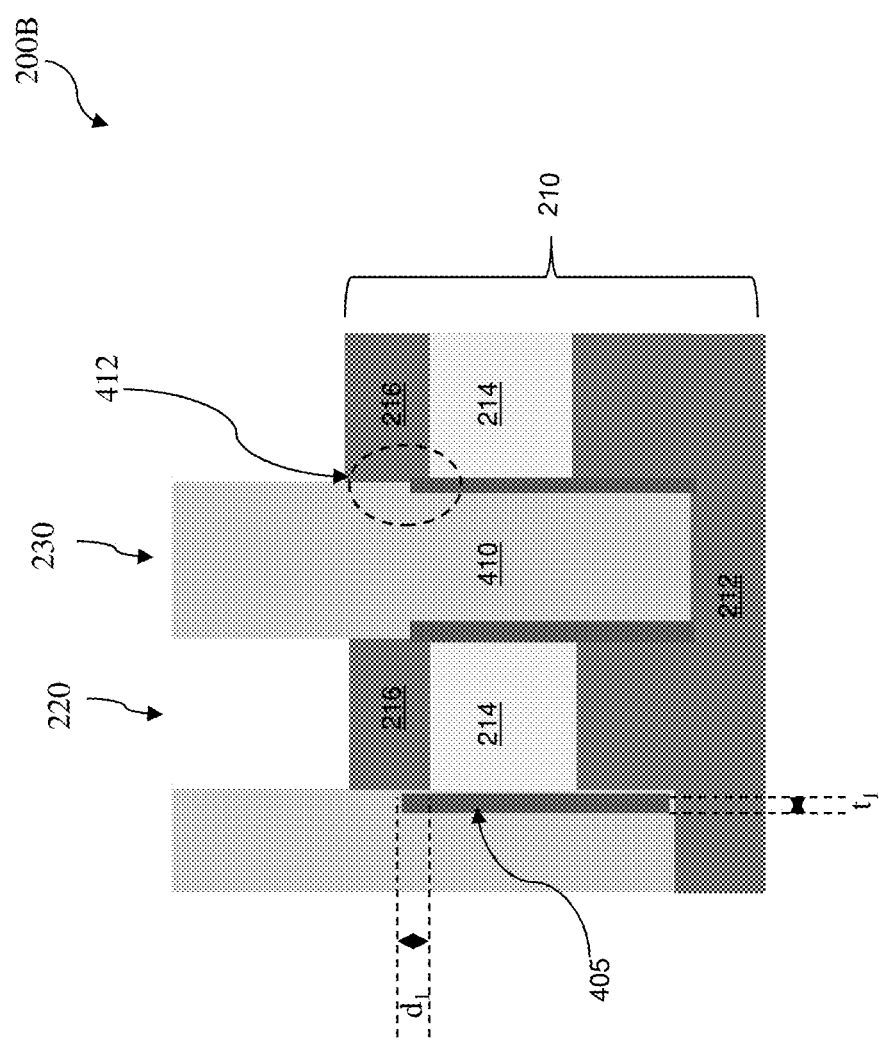
FIG. 10B is a cross-sectional view of an example FinFET device along the line B-B in FIG. 10A at fabrication stages constructed according to the method of FIG. 1.

For the sake of clarity to better description, the first fin structure 220 having the dielectric anchor 411 is referred to as a third fin structure 420, as shown in FIG. 9C. The third fin structure 420 has the third semiconductor layer 216 as its upper portion, the dielectric anchor 411 as its middle portion and the first semiconductor layer 212 as its bottom portion. In another words, the dielectric anchor 411 separates the third semiconductor layer 216 from the first semiconductor layer 212.

Referring also to FIGS. 1, 9A and 10A-10B, the method 100 proceeds to step 118 by recessing the liner 405 and the first fin structure 220 in the PFET device 200B. First a third patterned HM layer 415 is formed over the substrate 210 to cover the NFET 200A and leave the PFET 200B be uncovered. The third patterned HM layer 415 may include silicon nitride, silicon oxynitride, silicon carbide, or any other suitable dielectric material. The third patterned HM layer 415 may be formed similarly to forming of the second patterned HM layer 320 in step 110. Then the liner 405 and the third semiconductor material layer 216 in the first fin structure 220 in the PFET 200B are recessed, while the NFET 200A is protected by the third patterned HM layer 415. The liner 405 and the third semiconductor material layer 216 are recessed by proper etching processes, such as a selective wet etch, a selective dry etch, or a combination thereof. Alternatively, the liner 405 and the third semiconductor material layer 216 are recessed through a patterned photoresist layer formed over the PFET 200B.

In present embodiment, the recessing processes are controlled to have a top surface of the remaining liner 405 below the remaining third semiconductor material layer 216 but above the second semiconductor material layer 214 with a first distance $d_1$. As has been mentioned previously, the first distance $d_1$ is designed to be adequate to retard/prevent an upwards-out-diffusion of the second semiconductor material 214, along an interface 412 of the dielectric layer 410 and the third semiconductor material layer 216, into the upper portion of the first fin structures 220, where a gate channel will be formed later. For example, the first distance $d_1$ is adequate to retard the upwards out-diffusion of Ge in the SiGe layer 214 along the interface 412 of the dielectric layer 410 and the Si layer 216. In one embodiment, the first distance $d_1$ is in a range of about 2 nm to about 10 nm.

Figure 11:
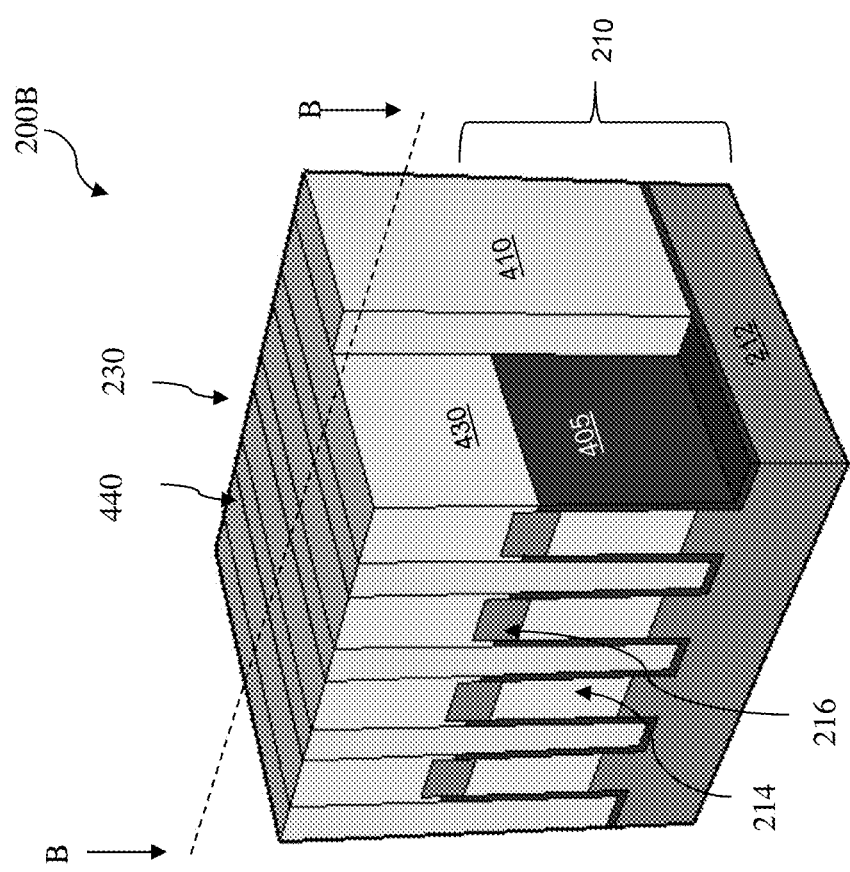
FIG. 11 is a diagrammatic perspective view of a FinFET device undergoing processes in accordance with some embodiments.
Figure 12A:
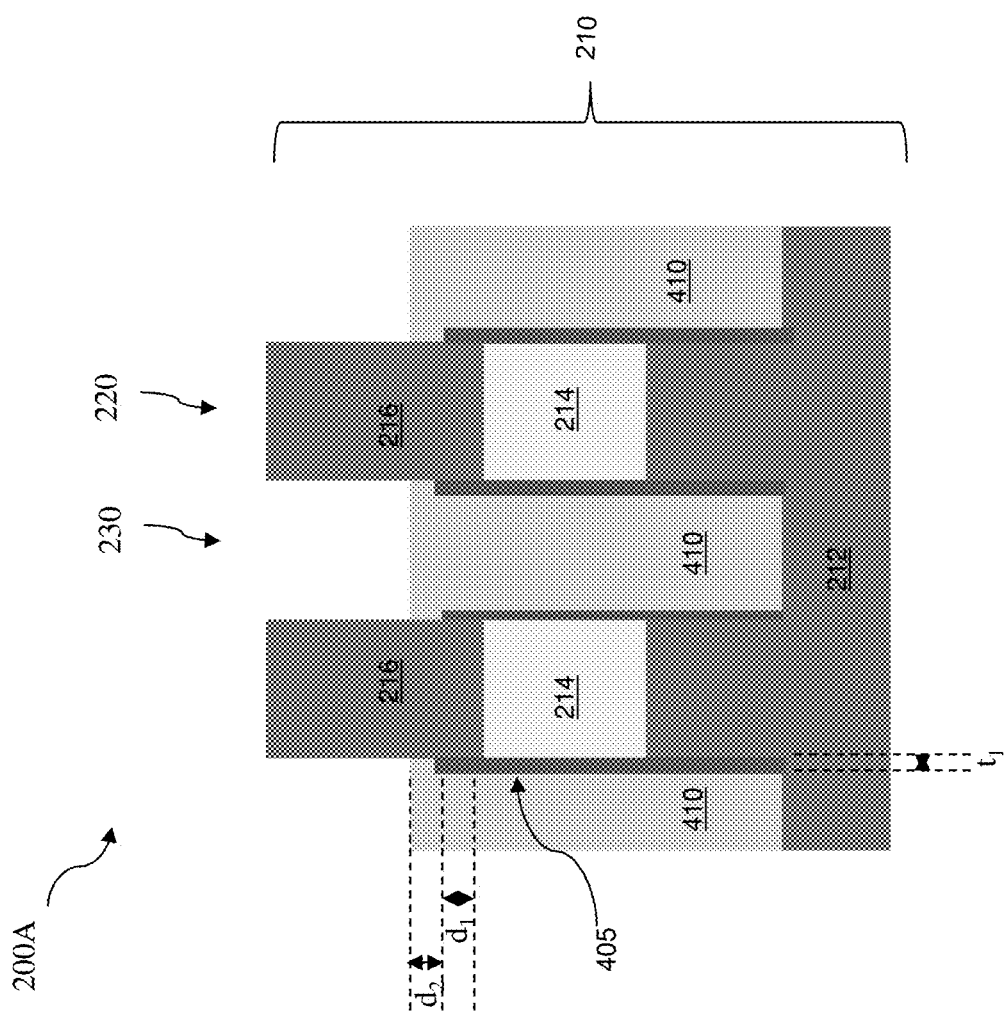
FIG. 12A is a cross-sectional view of an example FinFET device along the line AAA-AAA in FIG. 9A at fabrication stages constructed according to the method of FIG. 1.
Figure 12B:
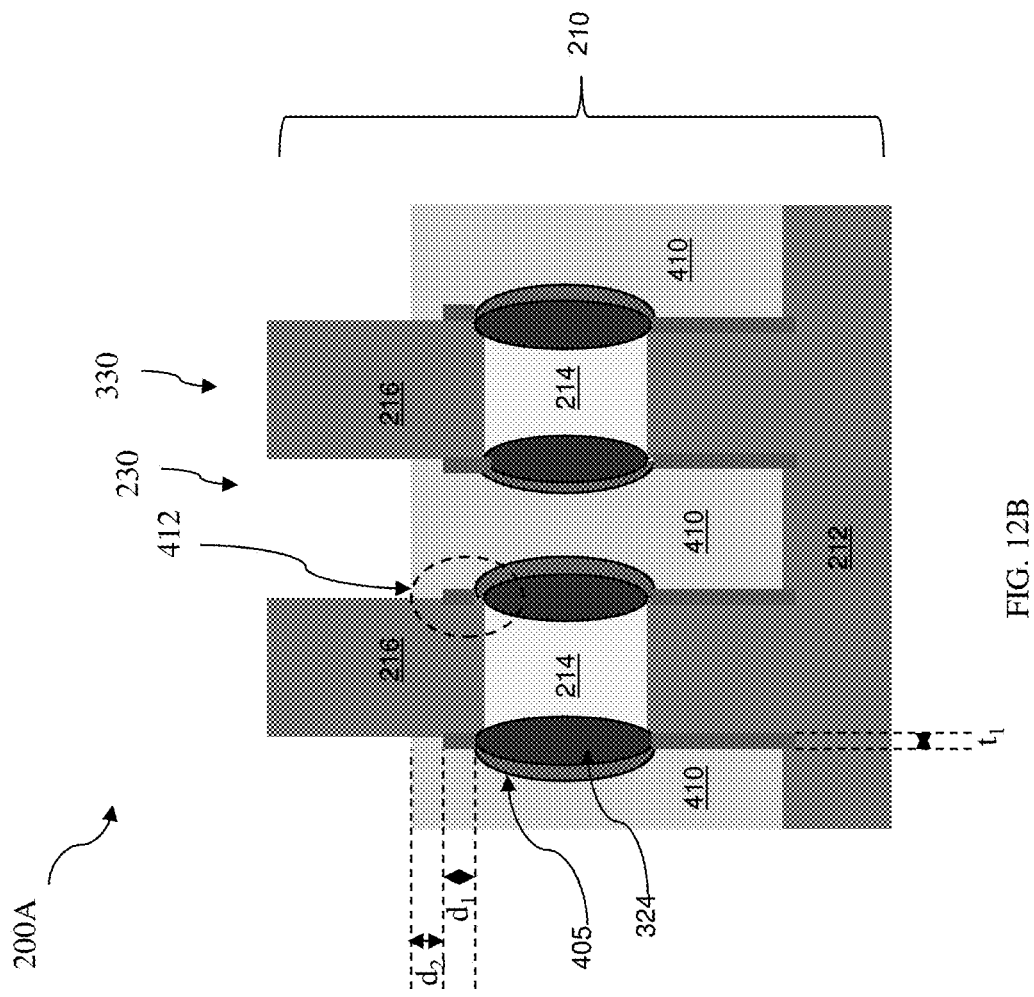
FIG. 12B is a cross-sectional view of an example FinFET device along the line A-A in FIG. 9A at fabrication stages constructed according to the method of FIG. 1.
Figure 12C:
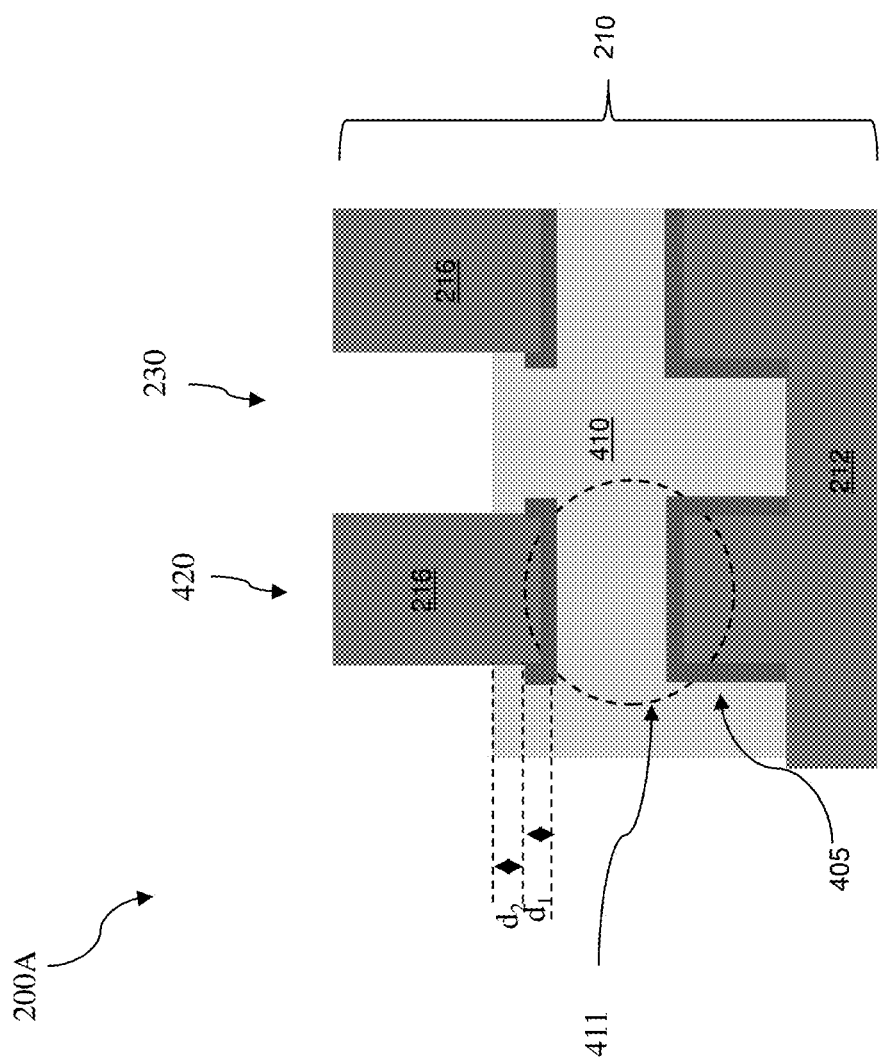
FIG. 12C is a cross-sectional view of an example FinFET device along the line AA-AA in FIG. 9A at fabrication stages constructed according to the method of FIG. 1.

Referring also to FIGS. 1, 9A and 11, the method 100 proceeds to step 120 by forming a fourth fin structure 440 in the PFET device 200B. A fourth semiconductor material layer 430 is deposited over the recessed first fin structure 220 to form the fourth fin structure 440. The fourth semiconductor material layer 430 may be deposited by epitaxial growth. The epitaxial process may include CVD deposition techniques, molecular beam epitaxy, and/or other suitable processes. The fourth semiconductor material layer 430 may include germanium (Ge), silicon (Si), gallium arsenide (GaAs), aluminum gallium arsenide (AlGaAs), silicon germanium (SiGe), gallium arsenide phosphide (GaAsP), or other suitable materials. In one embodiment, the fourth semiconductor material layer 430 is same as the second semiconductor material layer 214, SiGe. Thus, the fourth fin structure 440 is formed to have the fourth semiconductor material layer 430 as its upper portion, the third semiconductor material layer 216 as its upper middle portion, the second semiconductor material layer 214 as its lower middle portion and the first semiconductor material layer 212 as its bottom portion.

A CMP process may be performed thereafter to remove excessive the fourth semiconductor material layer 430 and planarize the top surface of the PFET device 200B. The third patterned HM layer 415 in the NFET device 200A is removed by a proper etching process, such as a wet etch, a dry etch, or a combination thereof.

Referring to FIGS. 1 and 12A-12D, the method 100 proceeds to step 122 by recessing the liner 405 in the NFET device 200A and recessing the dielectric layer 410 in both of the NFET device 200A and the PFET device 200B. First, the third patterned HM layer 415 is removed from the NFET device 200A by a proper etching process, such as a selective wet etch, or a selective dry etch. The liner 405 is then recessed by a proper etching process, such as a selective wet etch, a selective dry etch, or a combination thereof. In present embodiment, the recessing processes are controlled to have a top surface of the remaining liner 405 below the remaining third semiconductor material layer 216 but above the second semiconductor material layer 214 with the first distance $d_1$.

The dielectric layer 410 is then recessed in both of the NFET device 200A and the PFET device 200B to expose the upper portions of the respective fin features, such as first, second, third and fourth fin structures 220, 330, 420 and 440, respectively. In the present embodiment, the recessing processes are controlled to have a top surface of the recessed dielectric layer 410 above the top surface of the liner 405 with a second distance $d_2$, which is designed to be adequate to keep the liner 405 away from an upper portion of the first, the second and the third fin structures, where a gate region will be formed later, to avoid adverse impacts of the liner 405 to the gate region, such as fixed charges in the liner 405. In one embodiment, the second distance $d_2$ is in a range of about 3 nm to about 10 nm.

In one embodiment, the recessed dielectric layer 410 in the trench 230 forms shallow trench isolation (STI) features.

Figure 13B:
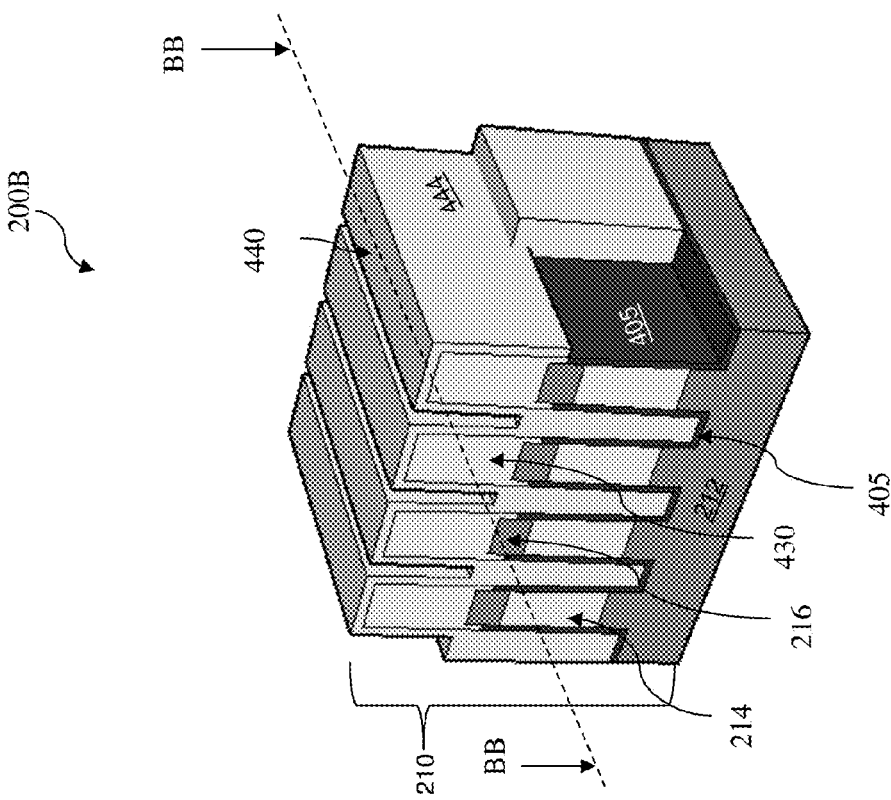
FIGS. 13A-13B are diagrammatic perspective views of a FinFET device undergoing processes in accordance with some embodiments.
Figure 13A:
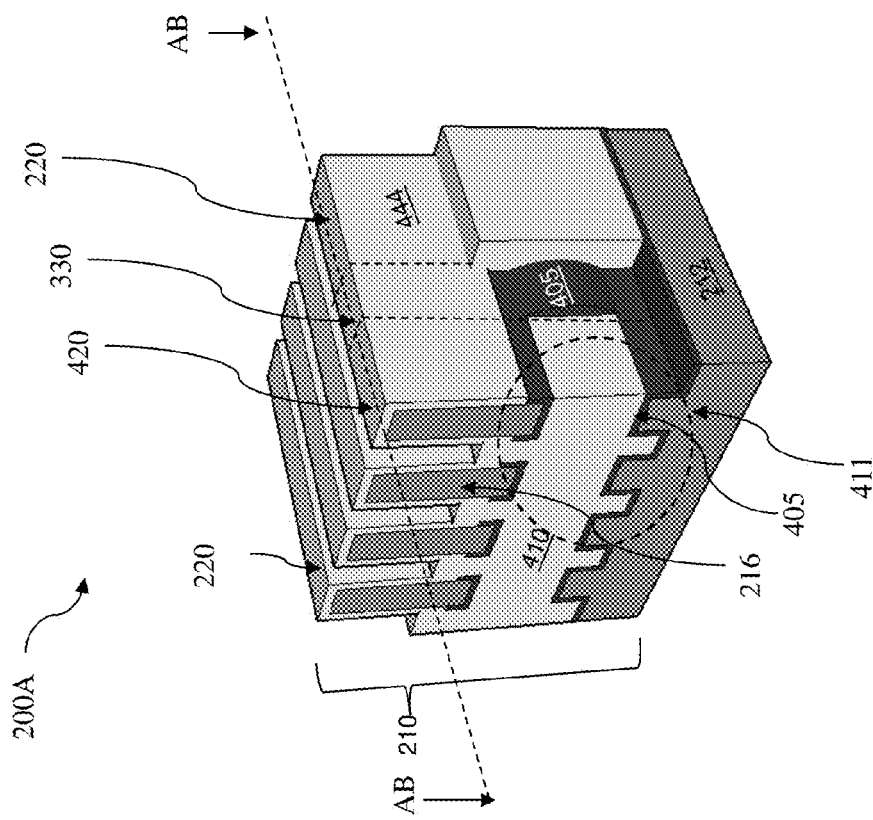

Referring to FIGS. 1 and 13A-13B, the method 100 proceeds to step 124 by depositing a dummy dielectric layer 444 over the substrate 210, including wrapping over the first, second, third and fourth fin structures, 220, 330, 420 and 440. The dummy dielectric layer 444 is designed to protect the first, second, third and fourth fin structures, 220, 330, 420 and 440 during a subsequent process of forming dummy gate stacks, which will be described later. The dummy dielectric layer 444 may be deposited by ALD, CVD, PVD and other suitable techniques. In one embodiment, the dummy dielectric layer 444 includes silicon oxide.

Figures 13C, 13D:
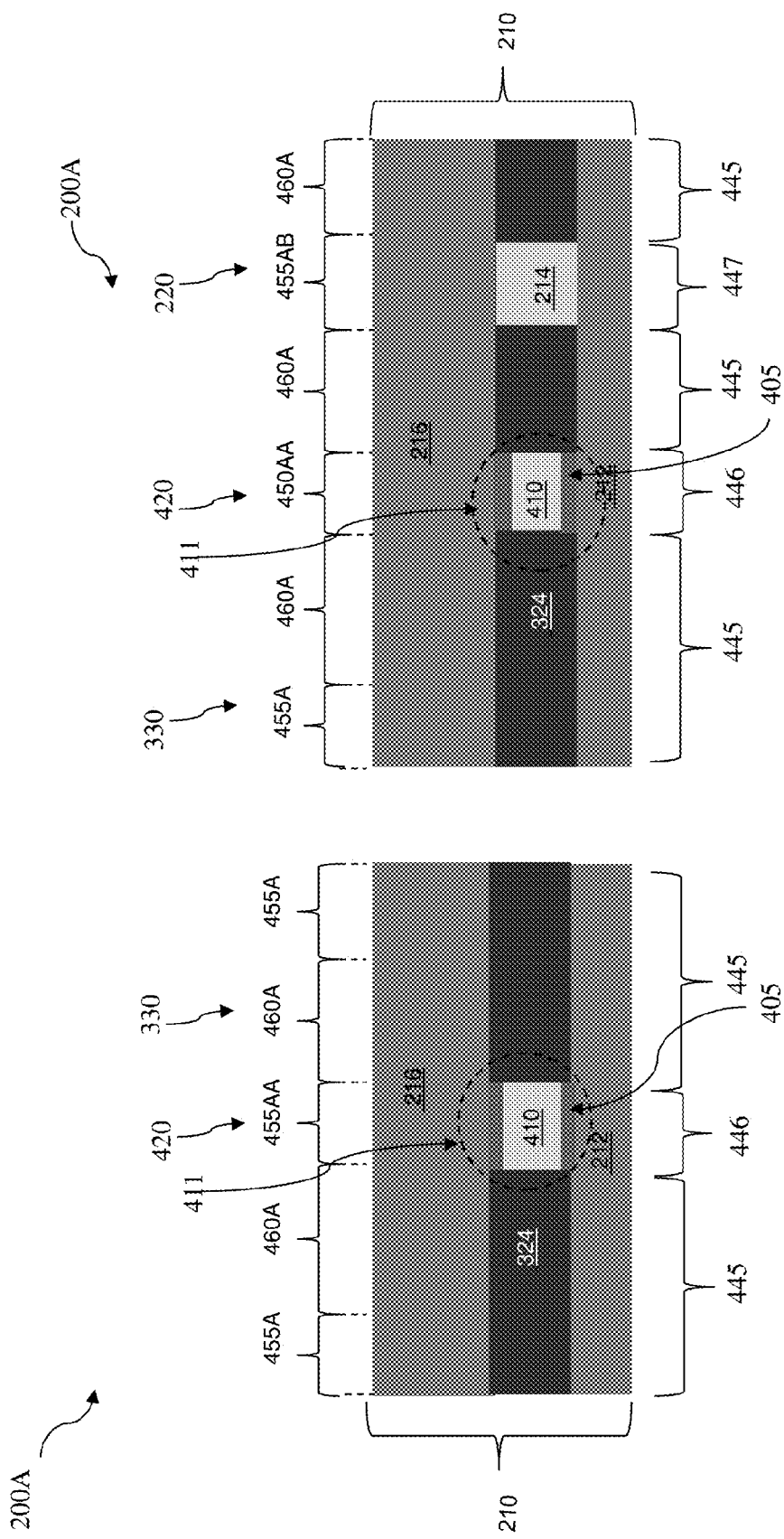
FIGS. 13C-13D are cross-sectional views of an example FinFET device along the line AB-AB in FIG. 13A at fabrication stages constructed according to the method of FIG. 1.

Referring to FIG. 13C, in some embodiments, the NFET device 200A includes a first section 445 and a second section 446. Two adjacent first sections 445 are separated by the second section 446. The first section 445 includes the second fin structures 330 and the second section 446 includes the third fin structure 420. The second fin structure 330 includes first source/drain (S/D) regions 455A and first gate regions 460A. Adjacent first S/D regions 455A are separated by the first gate region 460A. In one embodiment, the first section 445 includes one first gate region 460A. In another embodiment, the first section 445 includes more than one first gate regions 460A. The third fin structure 420 includes a second S/D region 455AA. The second S/D region 455AA separates two adjacent first gate regions 460A in respective two adjacent first sections 445.

Referring to FIG. 13D, in some embodiment, the NFET device 200A includes the first section 445, the second section 446 and a third section 447. The third section 447 includes the first fin structure 220. The first fin structure 220 includes a third S/D region 455AB. Two adjacent first sections 445 are separated by either the second section 446 or the third section 447.

Figures 13E, 13F:
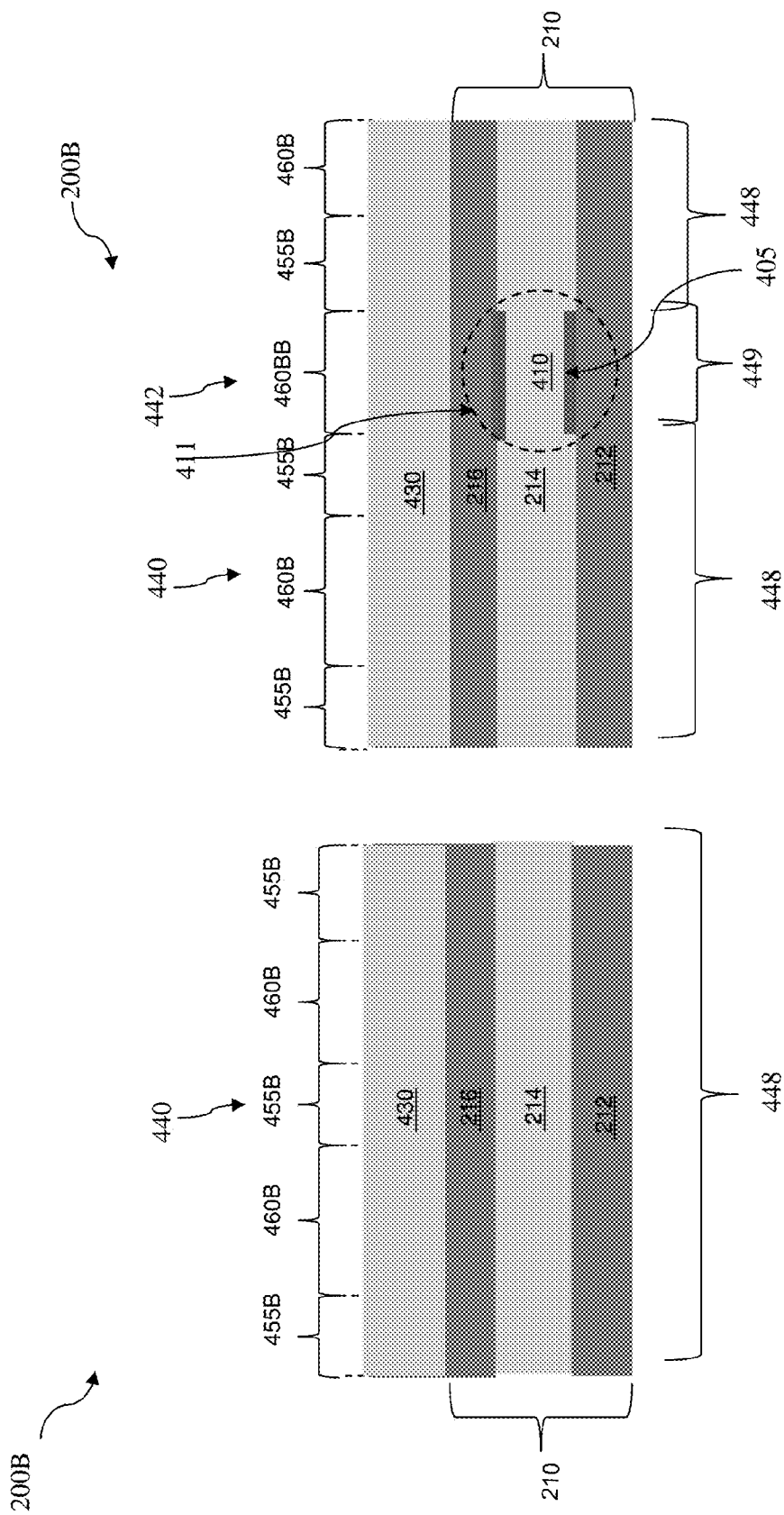
FIGS. 13E-13F are cross-sectional views of an example FinFET device along the line BB-BB in FIG. 13B at fabrication stages constructed according to the method of FIG. 1.

Referring to FIG. 13E, in some embodiment, the PFET device 200B includes a fourth section 448. The fourth section 448 includes the fourth fin structure 440. The fourth fin structure 440 includes fourth source/drain (S/D) regions 455B and second gate regions 460B. Two adjacent fourth S/D regions 455B are separated by the second gate region 460B. In one embodiment, the fourth section 448 includes one second gate region 460B. In another embodiment, the fourth section 448 includes more than one second gate region 460B.

Referring to FIG. 13F, in some embodiment, the PFET device 200B includes the fourth section 448 and a fifth section 449. The fifth section 449 includes a fifth fin structure 442, which has the fourth semiconductor material layer 430 as its upper portion, the third semiconductor material layer 216 as its upper middle portion, the dielectric layer 410 as its lower middle portion and the first semiconductor material layer 212 as its bottom portion. The fifth fin structure 442 includes a third gate region 460BB. Two adjacent fourth sections 448 are separated by the fifth section 449.

Figure 14B:
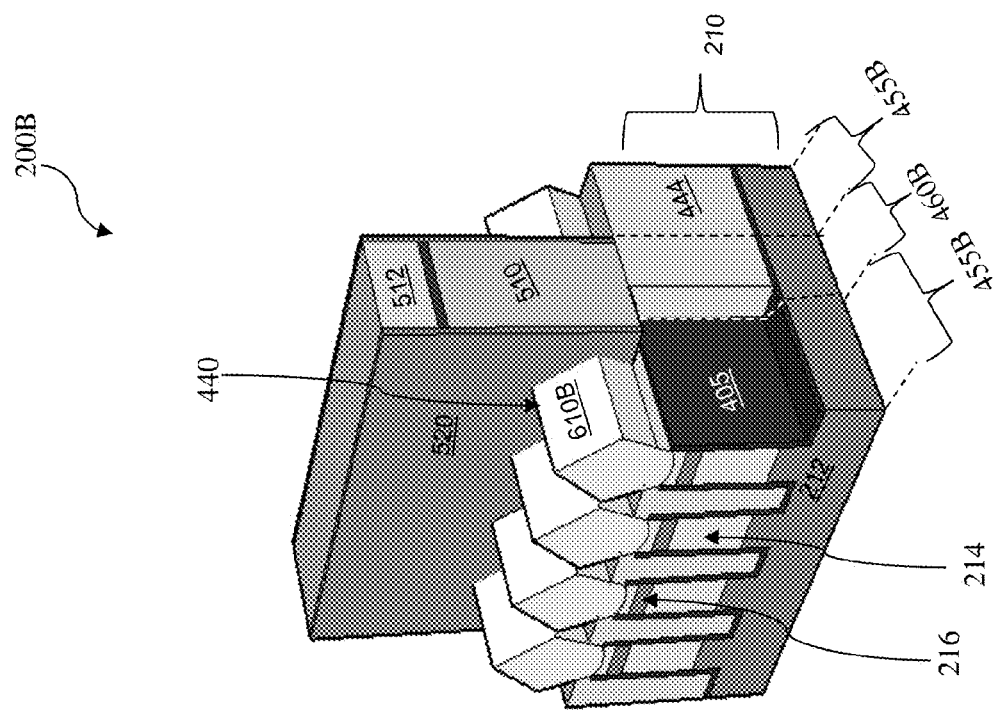
FIGS. 14A-14B, 15A-15B and 16A-16B are diagrammatic perspective views of a FinFET device undergoing processes in accordance with some embodiments.
Figure 14A:
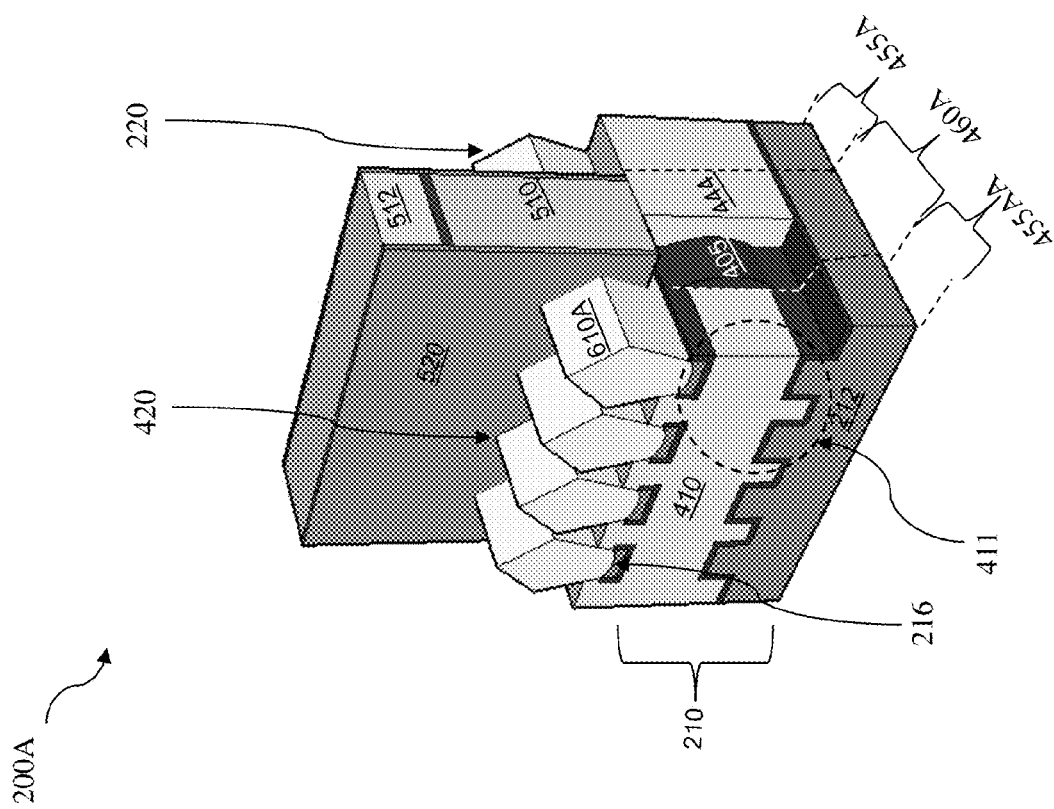

Referring to FIGS. 1 and 14A-14B, the method 100 proceeds to step 126 by forming a gate stack 510 and sidewall spacers 520 on sidewalls of the gate stack 510, in respective gate regions, such as the first gate region 460A and the second gate regions 460B (as shown in FIGS. 14A and 14B), as well as the third gate region 460BB (not shown). In one embodiment using a gate-last process, the gate stack 510 is a dummy gate and will be replaced by the final gate stack at a subsequent stage. Particularly, the dummy gate stacks 510 are to be replaced later by a high-k dielectric layer (HK) and metal gate electrode (MG) after high thermal temperature processes, such as thermal annealing for S/D activation during the sources/drains formation. The dummy gate stack 510 is formed on the substrate 210 and is partially disposed over the second fin structure 330 in the first gate region 460A, the fourth fin structure 440 in the second gate region 460B and the fifth fin structure 442 in the third gate region 460BB. In one embodiment, a gate hard mask (GHM) 512 is formed over the dummy gate stack 510. The dummy gate stack 510 is formed by a suitable procedure including deposition and patterning. The patterning process further includes lithography and etching. In various examples, the deposition includes CVD, physical vapor deposition (PVD), ALD, thermal oxidation, other suitable techniques, or a combination thereof. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

The dummy gate stack 510 may include a dummy gate dielectric layer and an electrode layer over the dummy gate dielectric layer. The dummy gate dielectric layer includes silicon oxide. Alternatively or additionally, the dielectric layer 512 may include silicon nitride, a high-k dielectric material or other suitable material. The electrode layer 514 may include polycrystalline silicon (polysilicon). The GHM 516 includes a suitable dielectric material, such as silicon nitride, silicon oxynitride or silicon carbide. The sidewall spacers 520 may include a dielectric material such as silicon oxide, silicon nitride, silicon carbide, silicon oxynitride, or combinations thereof. The sidewall spacers 520 may include a multiple layers. Typical formation methods for the sidewall spacers 520 include depositing a dielectric material over the gate stack 510 and then anisotropically etching back the dielectric material. The etching back process may include a multiple-step etching to gain etch selectivity, flexibility and desired overetch control.

Referring again to FIGS. 1 and 14A-14B, the method 100 proceeds to step 128 by forming a first S/D features 610A in the first and second S/D regions, 455A and 455AA (as shown in FIG. 14A), and the third S/D region 455AB (not shown). In one embodiment, the first S/D features 610A is formed by recessing a portion of the upper portion of the first, second and third fin structures, 220, 330 and 420 in the respective third, first and second S/D regions, 455AB, 455A and 455AA. In one embodiment, the first, second and third fin structures 220, 330 and 420 are recessed in one etching process. In another embodiment, the first, the second and the third fin structures 220, 330 and 420 are recessed in different etching processes.

The second S/D feature 610B is formed by recessing a portion of the upper portion of the fourth fin structure 440 in the fourth S/D region 455B (as shown in FIG. 14B).

In present embodiment, for gaining process integration flexibility, the recessing process is controlled to have a portion of the third semiconductor material layer 216 remain in the first and the third fin structures 220 and 420 and have a portion of the fourth semiconductor material layer 430 remain in the fourth fin structure 440 and fifth fin structure 442.

The first S/D features 610A are then epitaxially grow on respective the recessed first fin structure 220 in the third S/D region 455AB, the recessed second fin structure 420 in the first S/D region 455A and the recessed third fin structure 420 in the second S/D region 455AA. The second S/D features 610B are epitaxially grow on the recessed fourth fin structures 440 in the fourth S/D region 455B. The first and the second S/D features, 610A and 610B, include Ge, Si, GaAs, AlGaAs, SiGe, GaAsP, or other suitable material. The first and the second S/D features, 610A and 610B, may be formed by one or more epitaxy or epitaxial (epi) processes. The first and the second S/D features, 610A and 610B, may also be doped, such as being in-situ doped during the epi processes. Alternatively, the first and the second S/D features, 610A and 610B, are not in-situ doped and implantation processes (i.e., a junction implant process) are performed to dope the first and the second S/D features, 610A and 610B.

Figures 15A, 15B:
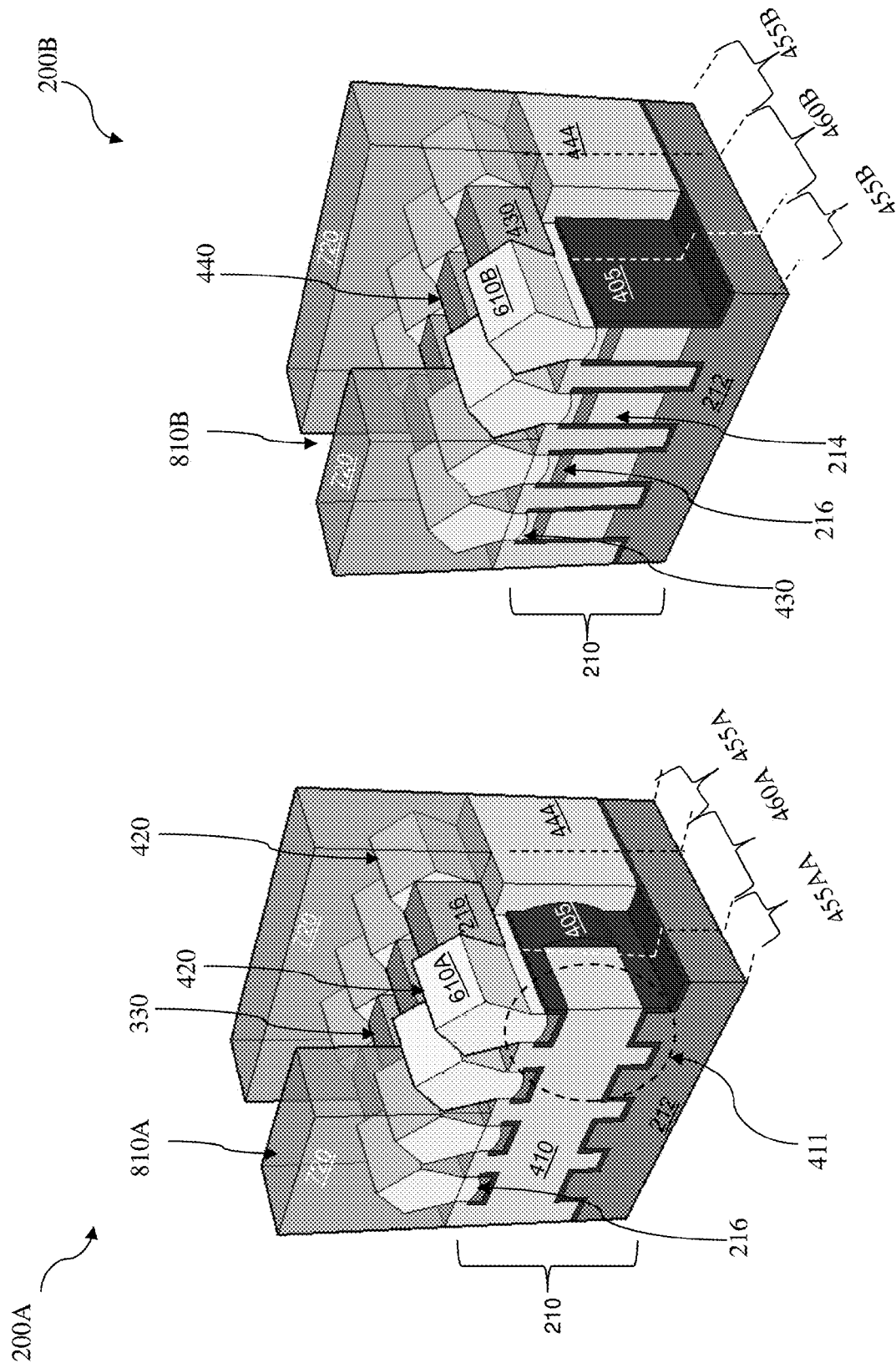
Figures 16A, 16B:
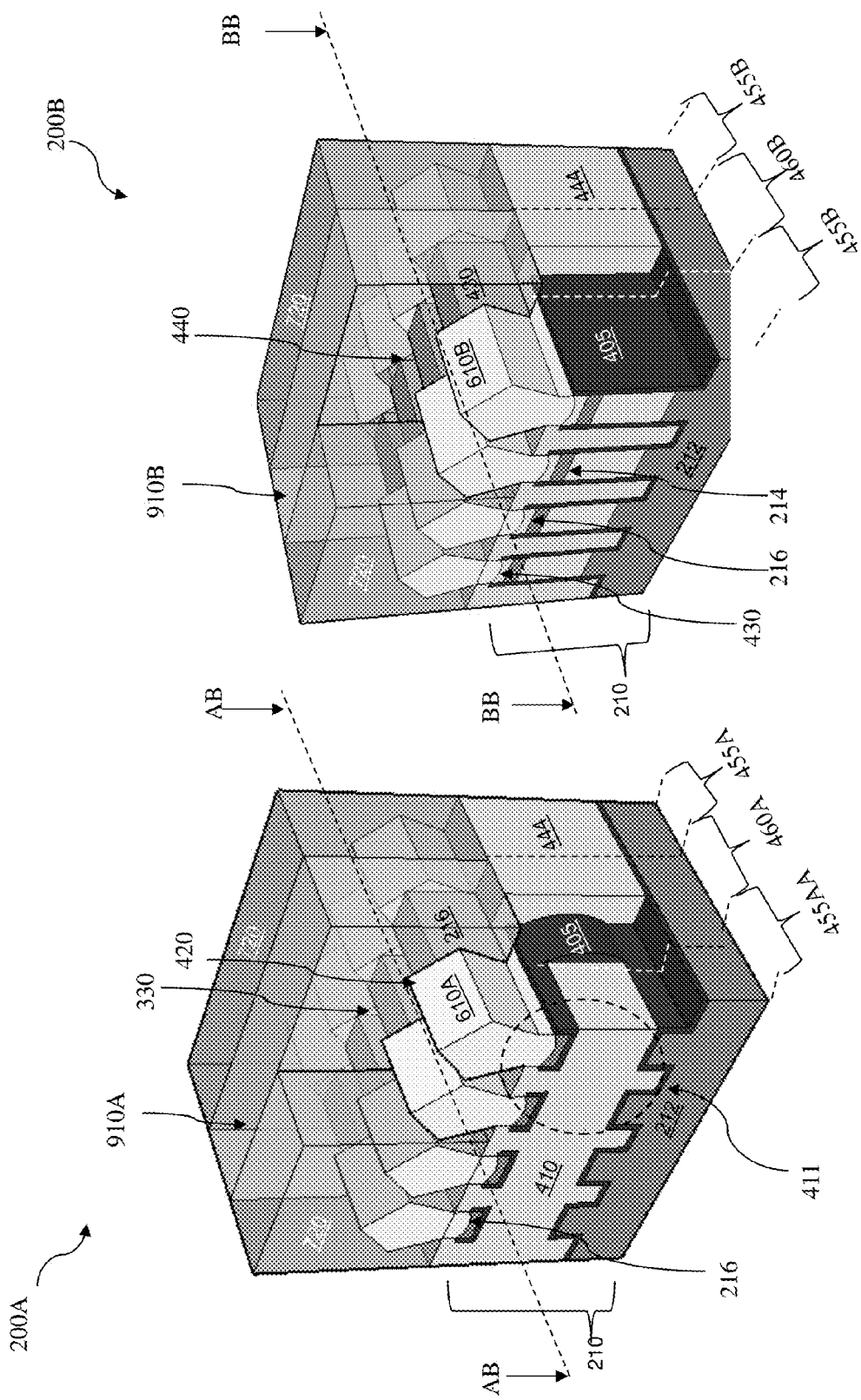

Referring to FIGS. 1 and 15A-15B, the method 100 proceeds to step 130 by forming an interlayer dielectric (ILD) layer 720 on the substrate 210 between the gaps of the dummy gate stacks 510. The ILD layer 720 includes silicon oxide, silicon oxynitride, low k dielectric material or other suitable dielectric materials. The ILD layer 720 may include a single layer or alternative multiple layers. The ILD layer 720 is formed by a suitable technique, such as CVD, ALD and spin-on (SOG). A chemical mechanical polishing (CMP) process may be performed thereafter to remove excessive ILD layer 720 and planarize the top surface of the FinFET device 200.

Referring again to FIGS. 1 and 15A-15B, the method 100 proceeds to step 132 by removing the dummy gate stacks 510 form one or more first gate trench 810A in the first gate region 460A, one or more second gate trench 810B in the second gate region 460B and one or more third gate trench 810C in the third gate region 460BB (not shown). The upper portion of the second fin structure 330 is exposed in the first gate trench 810A (as shown in FIG. 15A), the upper portion of the respective fourth fin structure 440 are exposed in the second gate trench 810B (as shown in FIG. 15B) and the upper portion of the fifth fin structure 442 in the third gate trench 810C (not shown). The dummy gate stacks 510 are removed by an etch process (such as selective wet etch or selective dry etch) designed to have an adequate etch selectivity with respect to the third semiconductor material layer 216 and the fourth semiconductor material layer 430. The etch process may include one or more etch steps with respective etchants. The gate hard mask layer 516 and the spacers 520 are removed as well. Alternatively, the dummy gate stack 510 may be removed by a series of processes including photolithography patterning and etching process.

Referring to FIGS. 1 and 16A-16F, the method 100 proceeds to step 134 by forming a first and a second high-k/metal gate (HK/MG) stacks, 910A and 910B, over the substrate 210, including wrapping over the exposed portion of the second, the fourth and the fifth fin structures 330, 440 and 442, respectively. The first and the second HK/MG stacks, 910A and 910B, include gate dielectric layer and gate electrode on the gate dielectric. In one embodiment, the gate dielectric layer includes a dielectric material layer having a high dielectric constant (HK dielectric layer-greater than that of the thermal silicon oxide in the present embodiment) and the gate electrode includes metal, metal alloy or metal silicide. The formation of the first and the second HK/MG stacks, 910A and 910B, includes depositions to form various gate materials and a CMP process to remove the excessive gate materials and planarize the top surface of the NFET device 200A and the PFET device 200B.

In one embodiment, the gate dielectric layer includes an interfacial layer (IL) deposited by a suitable method, such as atomic layer deposition (ALD), CVD, thermal oxidation or ozone oxidation. The IL includes oxide, HfSiO and oxynitride. A HK dielectric layer is deposited on the IL by a suitable technique, such as ALD, CVD, metal-organic CVD (MOCVD), physical vapor deposition (PVD), other suitable technique, or a combination thereof. The HK dielectric layer may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitride (SiON), or other suitable materials. The gate dielectric layers wrap over the upper portion of the second fin structures 320 in the first gate region 460A and the upper portion of the third fin structures 440 in the second gate region 460B.

A metal gate (MG) electrode may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode may be formed by ALD, PVD, CVD, or other suitable process. The MG electrode may be formed separately for the NFET 200A and the PFET 200B with different metal layers. A CMP process may be performed to remove excessive MG electrode.

Referring to FIGS. 16C and 16D, in the NFET device 200A, the first HK/MG stacks 910A are formed over the first gate region 460A, includes wrapping over the upper portion of the second fin structure 330. Therefore, during forming the second semiconductor oxide feature 324 in the second fin structure 330, a proper strain is induced to the first gate region 460A and it will increase channel mobility. In the present embodiment, the second S/D regions 455AA, equipped with the dielectric anchors 411, locate adjacent to the first gate regions 460A in a periodical matter, such as every two first gate regions 460A, or every three first gate regions 460A. The dielectric anchors 411 will enhance strain induced to the first gate region 460A to increase channel electron mobility. Alternatively, with both of the dielectric anchors 411 in the second S/D regions 455AA and the second semiconductor layer 214 in the third S/D regions 455AB locate adjacent to the first gate regions 460A in a predetermined periodical matter, a strain induced to the first gate region 460A is enhanced and channel electron mobility is increased.

Referring to FIGS. 16E and 16F, in the PFET device 200B, the second HK/MG stacks 910B are formed over the second and third gate regions, 460B and 460BB, including wrapping over the upper portions of the fourth and fifth fin structures, 440 and 442. With the dielectric anchors 411 in the third gate region 460BB in a periodical matter, such as every two second gate regions 460B, or every three second gate regions 460B, a proper strain is induced to the second gate region 460B. The second S/D features 610B are formed over the fourth S/D regions 455B, separated by the second gate region 460B or the third gate region 460BB.

The FinFET device 200 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that includes one or more FinFET field-effect transistors. In furtherance of the example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional operations may be implemented before, during, and after the method 100, and some operations described above may be replaced or eliminated for other embodiments of the method.

Based on the above, the present disclosure offers structures of a FinFET. The structures employ a dielectric anchor to enhance strain induced to the gate region and shorten a long length fin structure. The structures demonstrate device performance improvement.

The present disclosure provides an embodiment of a fin-like field-effect transistor (FinFET) device. The device includes a plurality of first fin structures over a substrate. The first fin structure includes a first semiconductor material layer disposed over the substrate a second semiconductor material layer disposed over the first semiconductor material layer.

The second semiconductor material layer is formed of a second semiconductor material at least partially surrounded by a semiconductor oxide feature. The device also includes a third semiconductor material layer disposed over the second semiconductor material layer and a second fin structures over the substrate and adjacent to one of the first fin structures. The second fin structure includes the first semiconductor material layer disposed over the substrate, a dielectric layer with a liner disposed over the first semiconductor material layer. The liner disposed between the dielectric layer and the first semiconductor material layer. The second fin structure also includes the third semiconductor material layer disposed over the dielectric layer and the liner disposed between the dielectric layer and the third semiconductor material layer.

The present disclosure also provides another embodiment of a fin-like field-effect transistor (FinFET) device. The device includes a substrate having an n-type fin-like field-effect transistor (NFET) region. The NFET region includes a first gate stack wrapping over an upper portion of a first fin structure. The first fin structure has an epitaxial silicon (Si) layer as its upper portion, an epitaxial silicon germanium (SiGe) with a silicon germanium oxide (SiGeO) feature at its outer layer as its middle portion and an epitaxial Si as its bottom portion. The NFET region also includes a first source/drain (S/D) feature over a recessed upper portion of the first fin structure and a second S/D feature over a second fin structure. The second fin structure has a recessed epitaxial Si layer as its upper portion, a dielectric layer with a liner, wrapping over its top surface and its bottom surface, as its middle portion and the epitaxial Si as its bottom portion. Therefore two adjacent first gate stacks are separated either by the first S/D feature or by the second S/D feature.

The present disclosure also provides a method for fabricating a FinFET. The method includes providing a substrate having an n-type fin-like field-effect transistor (NFET) region and a p-type fin-like field-effect transistor (PFET) region. The method also includes forming first fin structures in the NFET region and the PFEN region. The first fin structure includes a first epitaxial semiconductor material layer as its upper portion a second epitaxial semiconductor material layer, with a semiconductor oxide feature at its outer layer, as its middle portion and a third semiconductor material layer as its bottom portion. The method also includes forming a first patterned hard-mask (HM) over the NFET region and PFEN region, forming a lateral trench, forming a second pattern HM over the NFET region and PFEN region to expose the second semiconductor material layer in the lateral trench in the NFET region. The method also includes applying annealing to form a semiconductor oxide feature at out layer of the exposed second semiconductor material layer to form a second fin structure. The method also includes forming a liner wrapping over the first and the second fin structures in both of the NFET region and the PFET region, depositing a dielectric layer to form a dielectric anchor in the lateral trench to form a third fin structure, forming a fourth and a fifth fin structures in the PFET region while covering the NFET region with a third HM, recessing the dielectric layer in both of the NFET region and the PFET region to expose upper portions of the first, second, third, fourth and fifth fin structures and depositing a dummy dielectric layer over the exposed first, second, third, fourth and fifth fin structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-like field-effect transistor (FinFET) device comprising:
    a plurality of first fin structures over a substrate, wherein each first fin structure includes:
        a first semiconductor material layer disposed over the substrate;
        a second semiconductor material layer disposed over the first semiconductor material layer, wherein the second semiconductor material layer is formed of a second semiconductor material at least partially surrounded by a semiconductor oxide feature; and
        a third semiconductor material layer disposed over the second semiconductor material layer; and
    a second fin structure over the substrate and adjacent to one of the first fin structures, wherein the second fin structure includes:
        the first semiconductor material layer disposed over the substrate;
        a dielectric layer with a liner disposed over the first semiconductor material layer, wherein the liner disposed between the dielectric layer and the first semiconductor material layer; and
        the third semiconductor material layer disposed over the dielectric layer, wherein the liner is disposed between the dielectric layer and the third semiconductor material layer.

2. The device of claim 1, further comprising:
    a plurality of first gate stacks over the substrate, wrapping over the third semiconductor material layer of a portion of the first fin structure;
    first source/drain (S/D) features, separated by the first gate stack, over a recessed third semiconductor material layer of the first fin structure; and
    a second S/D feature, separated by the first gate stack, over a recessed third semiconductor material layer of the second fin structure.

3. The device of claim 2, wherein the first gate stacks, the first S/D features and the second S/D feature are arranged such that:
    two adjacent first gate stacks are separated either by one of the first S/D features or by the second S/D feature.

4. The device of claim 1, further comprising a third fin structure over the substrate, the third fin structure including:
    the first semiconductor material layer disposed over the substrate;
    the second semiconductor material layer disposed over the first semiconductor material layer; and
    the recessed third semiconductor material layer disposed over the second semiconductor material layer.

5. The device of claim 4, wherein a third S/D feature disposes over a recessed third semiconductor material layer of the third fin structure.

6. The device of claim 5, wherein the first gate stacks, the first S/D features and the third S/D feature are arranged such that:
    two adjacent first gate stacks are separated either by the first S/D feature or by the third S/D feature.

7. The device of claim 1, wherein:
    the first semiconductor material layer includes epitaxial silicon (Si);

the second semiconductor material layer includes epitaxial silicon germanium (SiGe);
the semiconductor oxide feature includes silicon germanium oxide (SiGeO); and
the third semiconductor material layer includes epitaxial silicon (Si).

8. The device of claim 1, further comprising:
a plurality of fourth fin structures over the substrate, each fourth fin structure including:
   the first semiconductor material layer disposed over the substrate;
   the second semiconductor material layer disposed over the first semiconductor material layer;
   the third semiconductor material layer disposed over the second semiconductor material layer; and
   a four semiconductor material layer disposed over the third semiconductor material layer; and
a fifth fin structure over the substrate, including:
   the first semiconductor material layer disposed over the substrate;
   the dielectric layer disposed over the first semiconductor material layer;
   the third semiconductor material layer disposed over the dielectric layer; and
   a four semiconductor material layer disposed over the third semiconductor material layer.

9. The device of claim 8, further comprising:
a plurality of second gate stacks over the substrate, wrapping over the fourth semiconductor material layer and a portion of the third semiconductor material layer of the fourth fin structure;
a plurality of third gate stacks over the substrate, wrapping over the fourth semiconductor material layer and a portion of the third semiconductor material layer of the fifth fin structure; and
fourth S/D features, separated by either the second gate stack or the fifth gate stack, over a recessed fourth semiconductor material layer of the fourth fin structure.

10. The device of claim 8, wherein the fourth semiconductor material layer includes epitaxial silicon germanium (SiGe).

11. A fin-like field-effect transistor (FinFET) device comprising:
a substrate having an n-type fin-like field-effect transistor (NFET) region;
wherein the NFET region includes:
   a first gate stack wrapping over an upper portion of a first fin structure, wherein the first fin structure has an epitaxial silicon (Si) layer as its upper portion, an epitaxial silicon germanium (SiGe) with a silicon germanium oxide (SiGeO) feature at its outer layer as its middle portion and an epitaxial Si as its bottom portion;
   a first source/drain (S/D) feature over a recessed upper portion of the first fin structure; and
   a second S/D feature over a second fin structure over the substrate, wherein the second fin structure has a recessed epitaxial Si layer as its upper portion, a dielectric layer with a liner wrapping on its top and bottom surface, as its middle portion and the epitaxial Si as its bottom portion; and
   wherein two adjacent first gate stacks is separated by either the S/D feature over the first fin structure or the S/D feature over the second fin structure.

12. The device of claim 11, further comprising:
the substrate having a p-type fin-like field-effect transistor (PFET) region;
wherein the PFET region includes:
   a second gate stack wrapping over an upper portion of a third fin structure, wherein the third fin structure has an epitaxial silicon germanium (SiGe) as its upper portion, an epitaxial Si as a top section of its middle portion, another epitaxial SiGe as a bottom section of its middle portion and another epitaxial Si as its bottom portion;
   a third S/D feature over a recessed upper portion of the third fin structure;
   a third gate stack wrapping over an upper portion of a fourth fin structure, wherein the fourth fin structure has the epitaxial SiGe as its upper portion, the epitaxial Si as a top section of its middle portion, the dielectric layer with the liner as a bottom section of its middle portion and another epitaxial Si as its bottom portion; and
   wherein two adjacent S/D features are separated either by the second gate stack or by the third gate stack.

13. The device of claim 11, further comprising a fifth fin structure in the NFET region, the fifth fin structure includes:
the recessed epitaxial Si layer as its upper portion;
the epitaxial SiGe as its middle portion; and
the epitaxial Si as its bottom portion.

14. The device of claim 12, further comprising a fourth S/D feature formed over the fifth fin structure.

15. The device of claim 14, wherein two first adjacent gate stacks are separated by one of following S/D features:
the first S/D feature; or
the second S/D feature; or
the fourth S/D feature.

16. The device of claim 11, wherein the first, second and third gate stacks include high-k/metal gate (HK/MG) stacks.

17. The device of claim 12, wherein the liner disposed between the dielectric layer and the recessed epitaxial Si layer, and between the dielectric layer and the epitaxial Si layer.

18. A method, comprising:
providing a substrate having an n-type fin-like field-effect transistor (NFET) region and a p-type fin-like field-effect transistor (PFET) region;
forming first fin structures in the NFET region and the PFEN region, the first fin structure includes:
   a first epitaxial semiconductor material layer as its upper portion;
   a second epitaxial semiconductor material layer, with a semiconductor oxide feature at its outer layer, as its middle portion; and
   a third semiconductor material layer as its bottom portion;
forming a first patterned hard-mask (HM) over the NFET region and PFEN region;
forming a lateral trench;
forming a second pattern HM over the NFET region and PFEN region to expose the second semiconductor material layer in the lateral trench in the NFET region;
applying annealing to form a semiconductor oxide feature at out layer of the exposed second semiconductor material layer to form a second fin structure;
forming a liner wrapping over the first and the second fin structures in both of the NFET region and the PFET region;
depositing a dielectric layer to form a dielectric anchor in the lateral trench to form a third fin structure;
forming a fourth and a fifth fin structures in the PFET region while covering the NFET region with a third HM;

recessing the dielectric layer in both of the NFET region and the PFET region to expose upper portions of the first, second, third, fourth and fifth fin structures, and depositing a dummy dielectric layer over the exposed first, second, third, fourth and fifth fin structures.

19. The method of claim 18, further comprising:

forming dummy gates in a first gate region in the second fin structure, a second gate region in the fourth fin structure and a third gate region in the fifth fin structure;

forming a first source/drain (S/D) features in a first S/D region in the third fin structure, a second S/D region in the third fin structure and a third S/D region in the first fin structure in the NFET region; and forming a second S/D feature in a fourth S/D region in the fourth fin structure in the PFET region.

20. The method of claim 19, future comprising:

replacing the dummy gates by a high-k/metal gate (HK/MG) in both of the NFET region and PFET region.

* * * * *